(12) United States Patent
Li et al.

(10) Patent No.: US 10,431,382 B2
(45) Date of Patent: Oct. 1, 2019

(54) PRINTED CIRCUIT BOARD ASSEMBLY HAVING A DAMPING LAYER

(71) Applicant: Apple Inc., Cupertino, CA (US)

(72) Inventors: Gemin Li, Pleasanton, CA (US); Paul Martinez, Morgan Hill, CA (US); Benjamin A. Bard, Los Gatos, CA (US); Connor R. Duke, Sunnyvale, CA (US); Zhong-Qing Gong, Fremont, CA (US); Kevin R. Richardson, Sunnyvale, CA (US); Curtis C. Mead, Sacramento, CA (US); Kieran Poulain, San Francisco, CA (US); Sung Woo Yoo, Santa Clara, CA (US); Nelson J. Kottke, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 327 days.

(21) Appl. No.: 14/841,387

(22) Filed: Aug. 31, 2015

(65) Prior Publication Data
US 2017/0064811 A1    Mar. 2, 2017

(51) Int. Cl.
*H05K 7/00*    (2006.01)
*H01G 4/30*    (2006.01)
(Continued)

(52) U.S. Cl.
CPC ............... *H01G 4/30* (2013.01); *H01G 2/06* (2013.01); *H01G 4/224* (2013.01); *H05K 3/284* (2013.01); *H05K 1/141* (2013.01); *H05K 1/181* (2013.01); *H05K 2201/049* (2013.01); *H05K 2201/10015* (2013.01); *H05K 2201/2045* (2013.01);
(Continued)

(58) Field of Classification Search
CPC .......... H01G 4/224; H01G 4/30; H05K 1/141; H05K 1/181; H05K 2201/049; H05K 2201/10015; H05K 2201/2045; H05K 2203/1316; H05K 2203/1322; H05K 3/284
See application file for complete search history.

(56) References Cited

U.S. PATENT DOCUMENTS

| 5,025,666 A | 6/1991 | Kobayashi et al. |
|---|---|---|
| 6,382,532 B1 | 5/2002 | French et al. |

(Continued)

FOREIGN PATENT DOCUMENTS

| CN | 202209638 U | 5/2012 |
|---|---|---|
| CN | 202385411 U | 8/2012 |

(Continued)

OTHER PUBLICATIONS

Chinese Office Action dated Jul. 4, 2018 for related Chinese Patent Appln. No. 201610608381.0 8 pages.
(Continued)

*Primary Examiner* — Yuriy Semenenko
(74) *Attorney, Agent, or Firm* — Womble Bond Dickinson (US) LLP

(57) ABSTRACT

A printed circuit board (PCB) assembly having several electronic components mounted on a PCB and a damping layer covering the electronic components, is disclosed. Embodiments of the PCB assembly include an overmold layer constraining the damping layer against the PCB. Embodiments of the PCB assembly include an interposer between a capacitor of the electronic components and the PCB. Other embodiments are also described and claimed.

18 Claims, 16 Drawing Sheets

(51) Int. Cl.
  *H01G 4/224* (2006.01)
  *H05K 3/28* (2006.01)
  *H01G 2/06* (2006.01)
  *H05K 1/18* (2006.01)
  *H05K 1/14* (2006.01)
(52) U.S. Cl.
  CPC ............... *H05K 2203/1316* (2013.01); *H05K 2203/1322* (2013.01)

(56) References Cited

U.S. PATENT DOCUMENTS

| | | | |
|---|---|---|---|
| 6,512,658 B1 | 1/2003 | Jierapipatanakul et al. | |
| 6,649,991 B1* | 11/2003 | Chen ................... | H01L 23/055 257/291 |
| 6,911,166 B2 | 6/2005 | Neal | |
| 8,115,304 B1 | 2/2012 | Joshi et al. | |
| 8,638,543 B2 | 1/2014 | Ahn et al. | |
| 8,992,988 B2 | 12/2014 | Swett et al. | |
| 2003/0201535 A1 | 10/2003 | Chen et al. | |
| 2006/0113642 A1* | 6/2006 | Kajiki ................. | H01L 21/565 257/659 |
| 2008/0315410 A1* | 12/2008 | Johnson ............... | H01L 21/563 257/737 |
| 2009/0111393 A1* | 4/2009 | Scalisi ............. | B29C 45/14639 455/90.1 |
| 2013/0154079 A1* | 6/2013 | Kim ................... | H01L 23/3128 257/706 |
| 2014/0166351 A1 | 6/2014 | Lee et al. | |
| 2014/0218841 A1 | 8/2014 | Ning et al. | |
| 2015/0070864 A1* | 3/2015 | Rainer ................. | H01L 21/563 361/782 |
| 2015/0181710 A1* | 6/2015 | Rathburn ............. | H05K 1/0216 361/783 |
| 2015/0286245 A1 | 10/2015 | Drysdale et al. | |

FOREIGN PATENT DOCUMENTS

| | | | |
|---|---|---|---|
| CN | 102714031 A | | 10/2012 |
| CN | 203038259 U | | 7/2013 |
| CN | 203472033 U | | 3/2014 |
| EP | 1661945 | * | 5/2006 |

OTHER PUBLICATIONS

Second Chinese Office Action dated May 7, 2019 for related Chinese Appln. No, 201610608381.0 9 pages.

* cited by examiner

PRINTED CIRCUIT BOARD ASSEMBLY HAVING A DAMPING LAYER

BACKGROUND

Field

Embodiments related to printed circuit board (PCB) assemblies are disclosed. More particularly, embodiments related to PCB assemblies having several electronic components mounted on a PCB are disclosed.

Background Information

An electronic device, such as a computer and/or a mobile device, may include a printed circuit board (PCB) assembly having electronic components, such as integrated circuits and capacitors, mounted on a PCB. The electronic components may be electrically connected through a printed circuit having vias and traces. The electronic components may deform when a voltage ripple occurs in a driving electrical signal delivered through the printed circuit. Furthermore, the deformation of the electronic components can transmit deforming loads to the PCB, which can cause the PCB to vibrate. Such vibration may lead to radiation of audible acoustic noise from the PCB and the electronic devices of the PCB assembly.

SUMMARY

A printed circuit board (PCB) assembly may include a waterproofing layer surrounding electronic components mounted on a PCB. The waterproofing layer may function to protect the electronic components from moisture. The waterproofing layer, however, is typically over-molded using a rigid epoxy, so although it may prevent ingress of moisture to the electronic components, it can actually exacerbate the radiation of acoustic noise from the PCB assembly. More particularly, the electronic components can force the rigid waterproofing layer to vibrate along with the PCB, which may lead to increased acoustic noise radiation. For example, experimental test results have indicated that a PCB assembly having a rigid waterproofing layer can be 10 dBA louder than a PCB assembly without a rigid waterproofing layer. This increased acoustic noise from the PCB assembly may be undesirable for a user of an electronic device that includes the waterproofed PCB assembly.

In an embodiment, a PCB assembly includes one or more mechanisms to waterproof electronic components without substantially increasing acoustic noise radiation from the PCB assembly. The PCB assembly may include a printed circuit board (PCB) having a flexural modulus, several electronic components mounted on the PCB, and a damping layer covering electronic components and attached to the PCB at several locations around the electronic components. The damping layer may include a flexural modulus lower than the flexural modulus of the PCB. Furthermore, the PCB may include a first density and the damping layer may include a second density, such that a first ratio of the first flexural modulus to the first density is greater than a second ratio of the second flexural modulus to the second density. Thus, the damping layer may modify the vibrational characteristics of the PCB assembly in a manner that reduces acoustic noise radiation from the PCB assembly.

In an embodiment of the PCB assembly, an overmold layer covers the damping layer and is attached to the PCB at several locations around the damping layer. Thus, the overmold layer may be rigidly secured to the PCB to sandwich the damping layer and constrain the damping layer against the PCB. The overmold layer may be a waterproof layer that includes a flexural modulus higher than the flexural modulus of the damping layer. Furthermore, the damping layer may include a first damping loss factor higher than a damping loss factor of the overmold layer. Thus, the overmold layer may prevent moisture from migrating into the damping layer, and the damping layer may modify the vibrational characteristics of the PCB assembly in a manner that reduces acoustic noise radiation from the PCB assembly.

In an embodiment, an encapsulated capacitor is mounted on the PCB of the PCB assembly. More particularly, an encapsulation layer may cover the capacitor and be disposed between the damping layer and the PCB. That is, the encapsulation layer may form a thin film around the capacitor, and another capacitor may also be surrounded by a respective encapsulation layer such that the damping layer fills a lateral space between the encapsulated capacitors. Each encapsulation layer may provide waterproofing protection for the capacitor that it encapsulates, and furthermore, the encapsulation may improve mechanical coupling between the capacitors and the PCB. That is, the encapsulation layer may surround a periphery of the capacitor, and the damping layer may surround the encapsulation layer around the periphery. In an embodiment, the encapsulation layer(s) include a flexural modulus that is lower than the flexural modulus of the overmold layer. Thus, the encapsulation layer(s) may modify the vibrational characteristics of the PCB assembly in a manner that reduces acoustic noise radiation from the PCB assembly.

Additional components may be used to reduce acoustic noise radiation from a PCB assembly. For example, in an embodiment, a PCB assembly includes a capacitor mounted on a PCB, and a damping layer covering the capacitor and attached to the PCB at several locations around the capacitor. Additionally, the PCB assembly may include an interposer between the capacitor and the PCB. For example, the interposer may include an upper contact electrically connected to the capacitor, a lower contact electrically connected to the PCB, and a via electrically connected with the upper contact and the lower contact. The via may be laterally offset from one or more of the upper contact or the lower contact, and thus, the interposer may deform more easily between the contacts to absorb energy and reduce the transmission of vibration between the capacitor and the PCB.

In an embodiment, the capacitor includes a normal centerline perpendicular to the PCB, and the normal centerline is nearer to the lower contact than the upper contact. For example, a via of the interposer may include a first via segment extending downward from an upper contact on a top face of the interposer, and a second via segment extending upward from a lower contact on a bottom face of the interposer. The contacts may be laterally offset from each other such that the first via segment is laterally offset from the second via segment, and the second via segment is closer to the normal centerline.

The interposer of the PCB assembly may include at least two layers having one or more interface surfaces between a top face and a bottom face of the interposer. Thus, the first via segment may extend from the top face to an interface surface and the second via segment may extend from the bottom face to the interface surface. In an embodiment, a trace extends along the interface surface between the first via segment and the second via segment to complete an electrical circuit between the upper contact and the lower contact.

The PCB assembly may include an acoustic trap to reflect acoustic waves emitted by an electronic component coupled to the PCB, and thus prevent the acoustic waves from propagating toward and exciting the PCB. The acoustic trap may extend from the via along one of the interface surfaces to trap vibrational acoustics of a predetermined wavelength. For example, the acoustic trap may include a trap length equal to one-quarter of the predetermined wavelength, and thus, the acoustic trap may block the passage of acoustic waves having the predetermined wavelength.

In an embodiment, the PCB assembly having the damping layer and the interposer may also include an overmold layer and/or an encapsulation layer. For example, an overmold layer may cover the damping layer and be attached to the PCB at several locations around the damping layer. Furthermore, an encapsulation layer may cover the capacitor and be disposed between the damping layer and the PCB.

A method of fabricating a PCB assembly is provided. In an embodiment, the method includes mounting several electronic components on a printed circuit board (PCB) and depositing a damping layer over the electronic components. The damping layer may be a continuous layer covering the electronic components, and may fill a lateral space between the components and be attached to the PCB. Accordingly, the damping layer may alter the vibrational characteristics of the PCB and reduce noise radiation from the PCB assembly. The method may also include depositing an overmold layer over the damping layer such that the overmold layer is attached to the PCB at several locations around the damping layer to constrain the damping layer against the PCB. Furthermore, the method may include depositing an encapsulation layer over at least one of the electronic components, e.g., a capacitor. As described above, several electronic components may be encapsulated by respective encapsulation layers such that the damping layer fills a lateral space between the encapsulated electronic components.

In an embodiment, mounting of the capacitor on the PCB includes mounting the capacitor on an interposer such that an upper contact of the interposer is electrically connected to the capacitor. The interposer may also be mounted on the PCB, such that a lower contact of the interposer is electrically connected to the PCB. Furthermore, the upper contact and the lower contact of the interposer may be electrically connected by a via having one or more via segments between different layers of the interposer. Accordingly, at least one of the via segments may be laterally offset from one or more of the upper contact or the lower contact to reduce the stiffness beneath the terminals of the capacitor, and accordingly, to reduce the transmission of excitatory vibrations from the capacitor to the PCB.

In an embodiment, an epoxy-coated capacitor is provided. The epoxy-coated capacitor may be mounted on a PCB and/or may be incorporated in a PCB assembly. For example, the epoxy-coated capacitor may be mounted directly on the PCB or it may be mounted on an interposer that is electrically connected to the PCB. In an embodiment, the capacitor includes a capacitor body having a top surface and a periphery. The periphery may include a first height, and a coating may cover the top surface and a portion of the periphery. For example, the coating may include an epoxy that covers a portion of the periphery having a second height that is less than the first height. By way of example, the second height may be between 0.8 and 0.99 of the first height. In an embodiment, the epoxy is a low modulus epoxy. For example, the epoxy may include a modulus less than 1.0 GPa and/or less than 0.5 GPa, e.g., between 0.2 and 0.5 GPa. Accordingly, the low modulus epoxy coating may dampen excitatory vibrations from the capacitor.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

DETAILED DESCRIPTION

Figure 1:
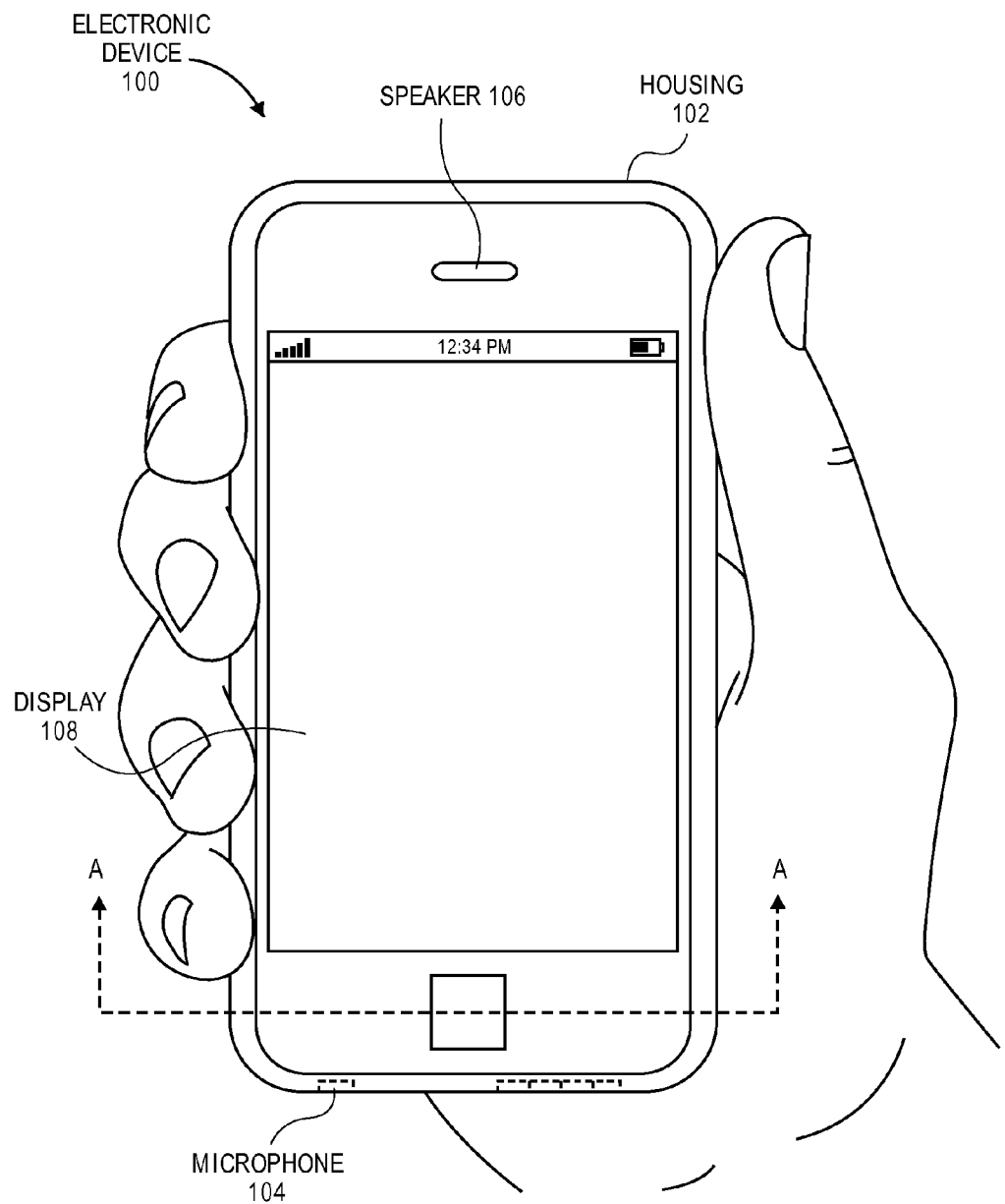
FIG. 1 is a pictorial view of an electronic device in accordance with an embodiment.

Embodiments describe printed circuit board (PCB) assemblies having one or more mechanisms to waterproof electronic components without substantially increasing acoustic noise radiation from the PCB assembly, particularly for use in electronic device applications. Some embodiments are described with specific regard to integration within mobile devices such as mobile phones. The embodiments are not so limited, however, and certain embodiments may also be applicable to other uses. For example, a PCB assembly as described below may be incorporated into other devices and apparatuses, including desktop computers, laptop computers, or motor vehicles, to name only a few possible applications.

In various embodiments, description is made with reference to the figures. Certain embodiments, however, may be practiced without one or more of these specific details, or in combination with other known methods and configurations. In the following description, numerous specific details are set forth, such as specific configurations, dimensions, and processes, in order to provide a thorough understanding of the embodiments. In other instances, well-known processes and manufacturing techniques have not been described in particular detail in order to not unnecessarily obscure the description. Reference throughout this specification to "one embodiment," "an embodiment," or the like, means that a particular feature, structure, configuration, or characteristic described is included in at least one embodiment. Thus, the appearance of the phrase "one embodiment," "an embodiment," or the like, in various places throughout this specification are not necessarily referring to the same embodiment. Furthermore, the particular features, structures, configurations, or characteristics may be combined in any suitable manner in one or more embodiments.

The use of relative terms throughout the description, such as "upward" and "downward" may denote a relative position or direction. For example, an electrical connection may be described as extending "downward" from a top surface and "upward" may be opposite to the downward direction. Nonetheless, such terms are not intended to limit the use of a PCB assembly to a specific configuration described in the various embodiments below. For example, a PCB assembly may be oriented in any direction with respect to an external environment, including such that a PCB surface supporting electronic components is facing upward, downward, sideways, etc., relative to the ground.

There are several ways to reduce acoustic noise radiation from a PCB assembly. For example, quieter capacitors such as non-uniform dielectric layer capacitors or dummy layer capacitors may be used. Several manners of reducing noise radiation, without directly altering the electronic components mounted on a PCB of the PCB assembly, are described below.

In an aspect, an electronic device includes a PCB assembly having several electronic components mounted on a PCB, and a baffle covering the electronic components. The baffle includes one or more layers having waterproofing and/or noise reducing characteristics. For example, a damping layer may cover the electronic components to prevent the ingress of moisture into the electronic components. Furthermore, the damping layer may have a flexural modulus that is lower than a flexural modulus of the PCB, such that the flexural wave speed of the PCB assembly is decreased and acoustic noise radiation is reduced.

Referring to FIG. 1, a pictorial view of an electronic device is shown in accordance with an embodiment. Electronic device 100 may be a smartphone device. Alternatively, it could be any other portable or stationary device or apparatus, such as a laptop computer or a tablet computer. Electronic device 100 may include various capabilities to allow the user to access features involving, for example, calls, voicemail, music, e-mail, internet browsing, scheduling, or photos. Electronic device 100 may also include hardware to facilitate such capabilities. For example, a housing 102 may contain a microphone 104 to pick up the voice of a user during a call, and an audio speaker 106, e.g., a micro speaker, to deliver a far-end voice to the near-end user during the call. Audio speaker 106 may also emit sounds associated with music files played by a music player application running on electronic device 100. A display 108 may present the user with a graphical user interface to allow the user to interact with electronic device 100 and/or applications running on electronic device 100. Other conventional features are not shown but may of course be included in electronic device 100.

Figure 2:
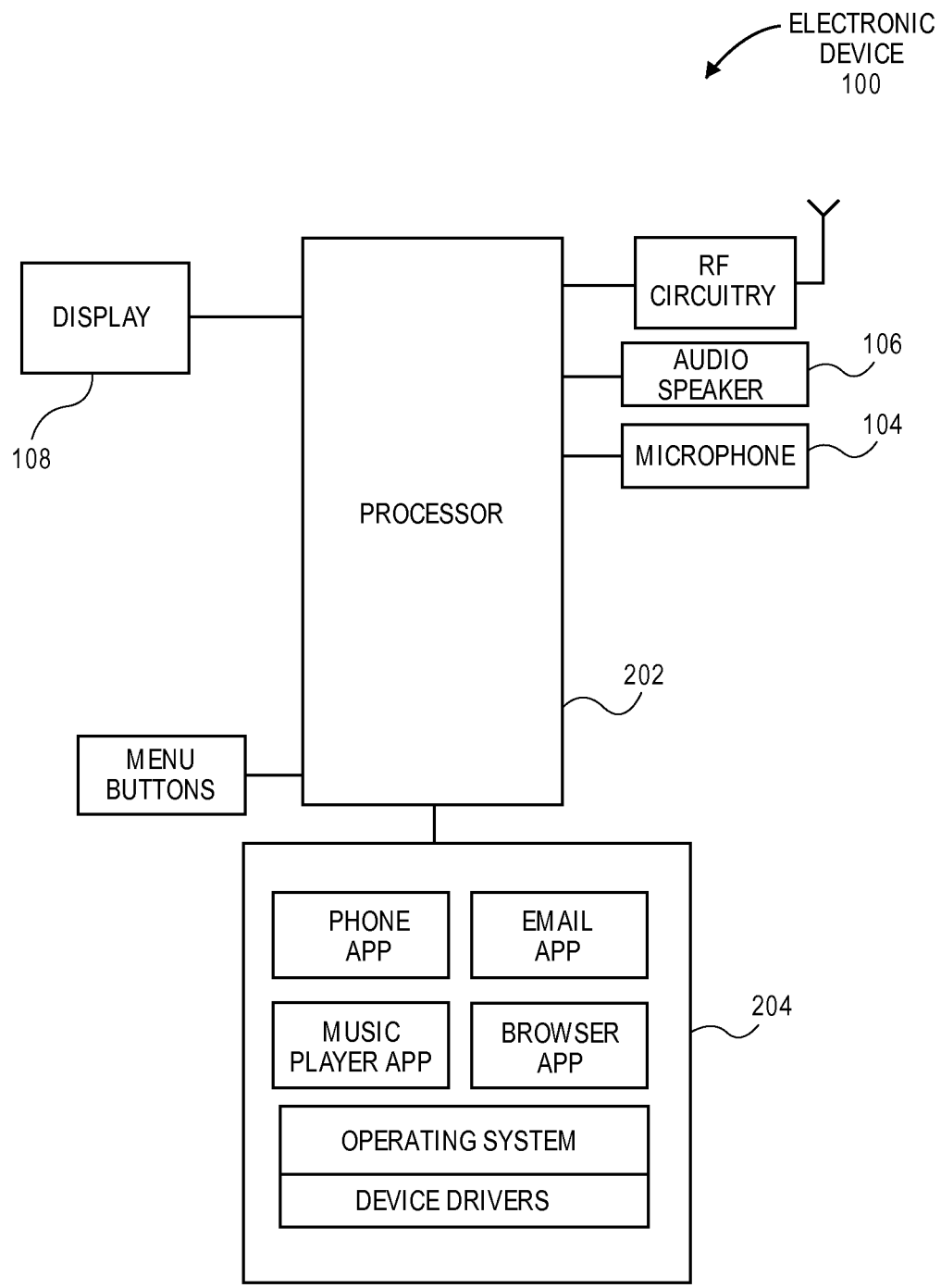
FIG. 2 is a schematic view of an electronic device in accordance with an embodiment.

Referring to FIG. 2, a schematic view of an electronic device is shown in accordance with an embodiment. As described above, electronic device 100 may be one of several types of portable or stationary devices or apparatuses with circuitry suited to specific functionality. Accordingly, the diagrammed circuitry is provided by way of example and not limitation. Electronic device 100 may include a PCB assembly (not shown) having several integrated circuits and other electronic components mounted on a PCB. For example, one or more processors 202 may be mounted on the PCB to execute instructions to carry out the different functions and capabilities described above. Instructions executed by processor(s) 202 of electronic device 100 may be retrieved from a local memory 204, and may be in the form of an operating system program having device drivers, as well as one or more application programs that run on top of the operating system. The instructions may cause electronic device 100 to perform the different functions introduced above, e.g., phone and/or music play back functions. To perform such functions, processor(s) 202 may directly or indirectly implement control loops and provide drive signals to other electronic components, such as one or more surface-mount capacitors (not shown). Voltage ripples in these drive signals may result in deformation of the capacitors and concomitant acoustic noise radiation from the PCB.

Figure 3:
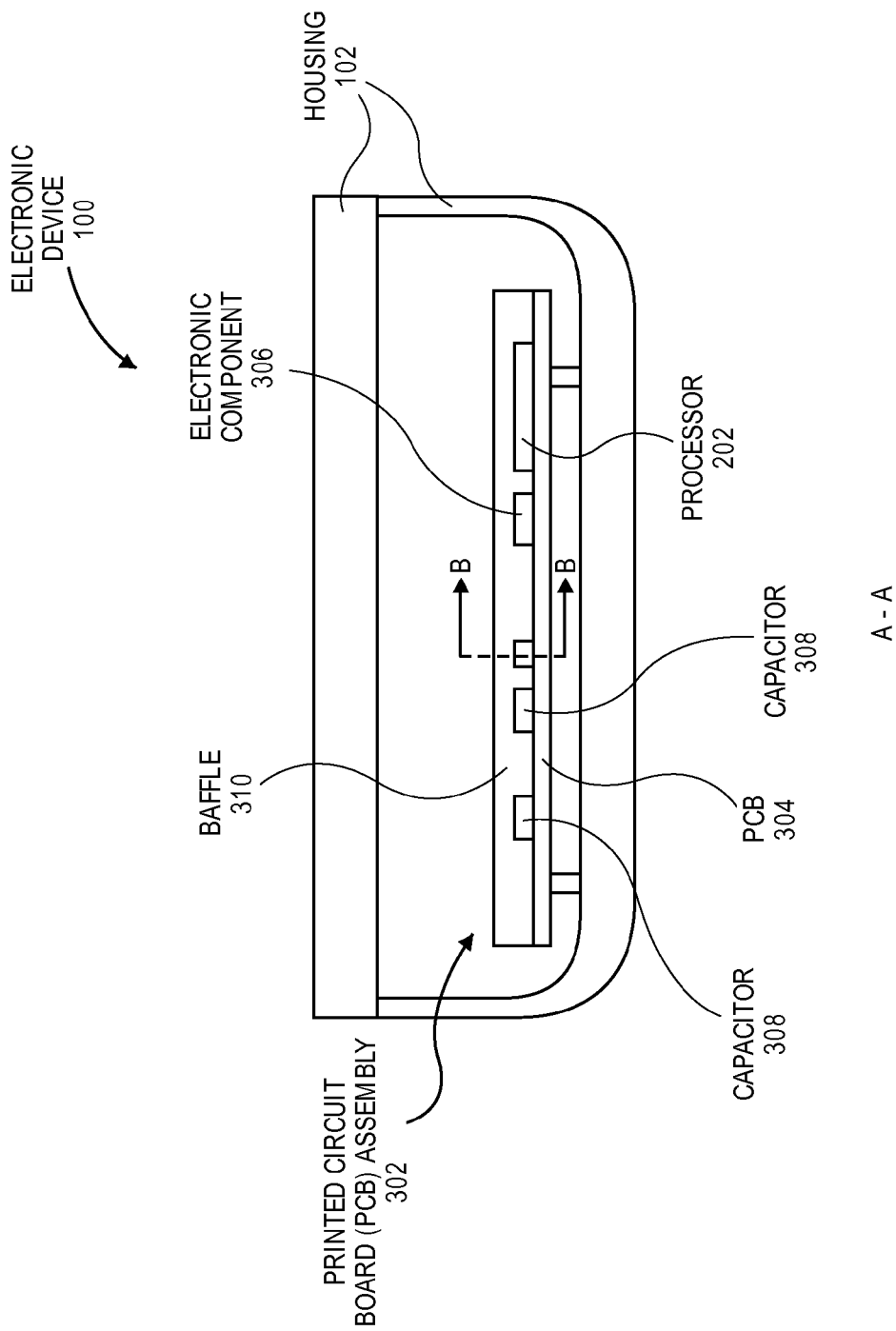
FIG. 3 is a sectional view, taken about line A-A of FIG. 1, of an electronic device having a printed circuit board (PCB) assembly in accordance with an embodiment.

Referring to FIG. 3, a sectional view, taken about line A-A of FIG. 1, of an electronic device having a PCB assembly is shown in accordance with an embodiment. Electronic device 100 may include an enclosure that holds external device components such as display 108, speaker 106, and microphone 104, and the enclosure may also surround internal device components such as a PCB assembly 302. More particularly, housing components made from the same or different types of materials, e.g., plastic, ceramic, glass, or metal, may be mechanically coupled to form housing 102 surrounding an internal space. PCB assembly 302 may be enclosed in the internal space. For example, PCB assembly 302 may be mounted on a back surface of housing 102 to stabilize the assembly, and a front panel of housing 102 may cover the PCB assembly 302.

In an embodiment, PCB assembly 302 includes a PCB 304 supporting several electronic components 306, such as a capacitor 308 and processor 202. PCB 304 includes one or more layers of non-conductive substrate supporting one or more conductive sheets, e.g., copper sheets. The conductive sheets may be patterned to form a printed circuit having conductive traces, conductive pads, conductive vias, and other conductive interconnections to electrically connect electronic components 306 such as processor 202 and capacitor 308. Thus, electronic components 306 may be mounted on PCB 304 and electrically connected by the printed circuit to form a printed circuit assembly.

The printed circuit assembly of the PCB assembly 302 may be covered at least in part by a baffle 310. Baffle 310 may deflect, check, or regulate the passage of a fluid or sound between PCB 304 and the internal space within housing 102. More particularly, baffle 310 may cover at least a portion of the printed circuit assembly, including two or more electronic components 306 within that portion. Baffle 310 may cover and be attached to PCB 304 around the covered electronic components 306 to prevent the ingress of moisture and the egress of sound to/from the covered PCB portion.

Figure 4:
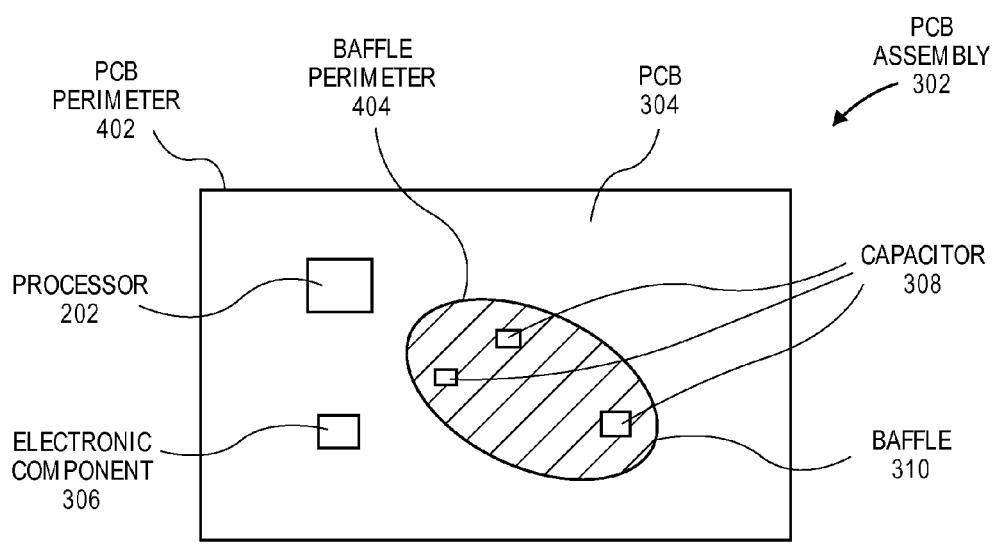
FIG. 4 is a top view of a PCB assembly having a baffle covering a PCB in accordance with an embodiment.

Referring to FIG. 4, a top view of a PCB assembly having a baffle covering a PCB is shown in accordance with an embodiment. PCB assembly 302 may include the printed circuit assembly covered partially by baffle 310. For example, PCB 304 may include a PCB perimeter 402 at an outer edge where a top surface of PCB 304 meets the sides of PCB 304, i.e., around the top surface of the PCB 304. Various electronic components 306 of the printed circuit assembly may be mounted on the top surface of PCB 304, and thus, may reside laterally inward of PCB perimeter 402. For example, in an embodiment, processor 202, capacitors 308, and one or more other electronic components 306, e.g., diodes, transistors, integrated circuits, or optoelectronic devices, are mounted on the top surface. In an embodiment, two or more capacitors 308 form a subset of the electronic components 306 mounted on PCB 304. The capacitors 308 may be surface-mount ceramic capacitors that deform when driven by an electrical signal having a voltage ripple. For example, ceramic capacitors may be Class I or Class II multilayer style (MLCC) ceramic capacitors. Each of the electronic components 306, including the capacitors 308, may be mechanically coupled to PCB 304 through a solder joint, e.g., by a high temperature solder connection, to electrically connect terminals of the electronic component 306 with respective conductive pads on the top surface of PCB 304.

Baffle 310 may cover several electronic components 306. Baffle 310 may be deposited over printed circuit assembly such that a baffle perimeter 404 defines the outer limits of baffle 310 in the lateral direction along the top surface of PCB 304. Furthermore, baffle perimeter 404 may follow a path along the top surface around two or more electronic components 306, e.g., several capacitors 308. Thus, baffle 310 may cover not only capacitors 308, but also the top surface of PCB 304 within the area defined by baffle perimeter 404. By contrast, baffle perimeter 404 may be laterally inward of PCB perimeter 402, and thus, other electronic components 306 (such as processor 202 shown in FIG. 4) may reside laterally outside of baffle 310 and not be protected from moisture within the internal space of housing 102.

Figure 5:
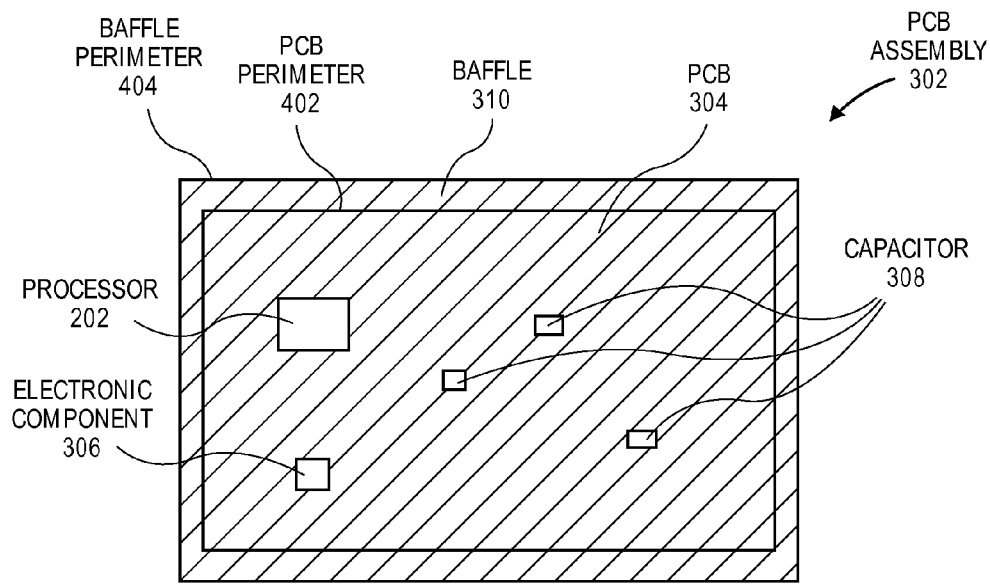
FIG. 5 is a top view of a PCB assembly having a baffle covering a PCB in accordance with an embodiment.

Referring to FIG. 5, a top view of a PCB assembly having a baffle covering a PCB is shown in accordance with an embodiment. In an embodiment, PCB assembly 302 may include baffle 310 that covers an entire PCB 304. For example, baffle 310 may extend over an entire top surface of PCB 304, as well as across one or more of the sides of PCB 304 that define PCB perimeter 402. In addition to covering one or more of the sides, baffle 310 may wrap around at least a portion of a bottom surface of PCB 304 and extend over some or all of the back surface. Thus, baffle 310 may cover an entire top surface of PCB 304, an entire top surface and one or more sides of PCB 304, and/or may encapsulate the entire PCB 304. Baffle 310 may also cover electronic components 306 mounted on the covered portion (top or back) of PCB 304. As shown in FIG. 5, when baffle 310 covers the entire top surface of printed circuit assembly, baffle perimeter 404 may extend laterally outside of PCB perimeter 402. Thus, baffle 310 may prevent the ingress of moisture or the egress of sound to/from the entire top surface of PCB 304.

Baffle 310 may be configured in numerous manners to waterproof PCB assembly 302 and/or to reduce the acoustic noise radiation from PCB assembly 302. Several embodiments are presented below that describe baffle 310 as including one or more layers of material specifically suited to these functions. For example, the layers of baffle 310 may not only directly prevent the passage of sound from a vibrating electronic component 306, but may also increase coupling between the electronic components 306 and PCB 304 to reduce overall board vibration, which has a noise reducing effect. Furthermore, baffle 310 may alter the bulk, i.e., composite, vibrational characteristics of PCB assembly 302, which may also have a noise reducing effect. Thus, an understanding of the following description may lead to other embodiments of baffle 310 having alternative arrangements of the described layers to protect a printed circuit assembly of PCB assembly 302 from moisture while reducing acoustic noise radiation from PCB assembly 302.

Figure 6:
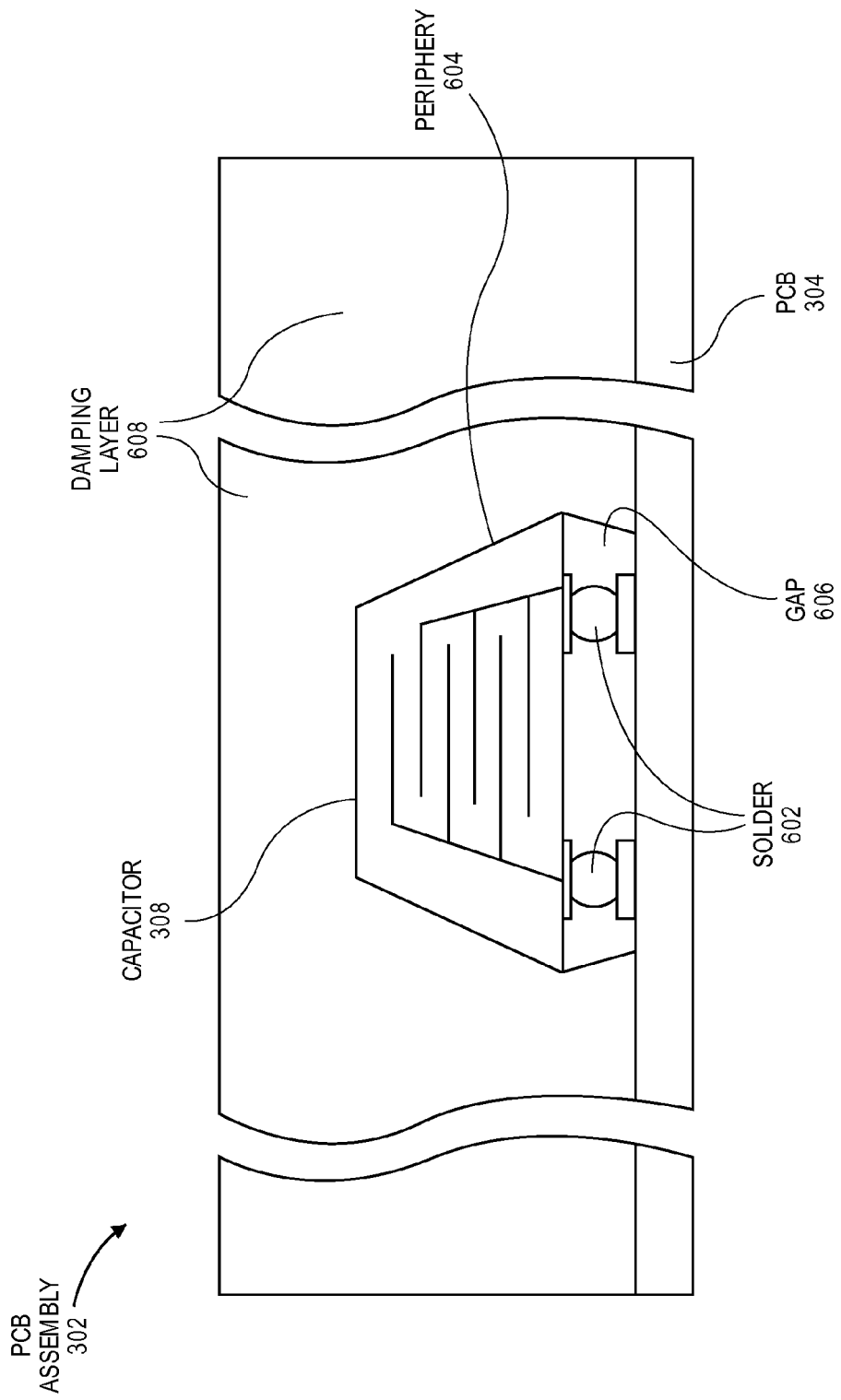
FIG. 6 is a sectional view, taken about line B-B of FIG. 3, of a PCB assembly having a damping layer covering several electronic components in accordance with an embodiment.

Referring to FIG. 6, a sectional view, taken about line B-B of FIG. 3, of a PCB assembly having a damping layer covering several electronic components is shown in accordance with an embodiment. In an embodiment, PCB assembly 302 includes at least one electronic component 306 mounted on PCB 304. For example, electronic component 306 may be capacitor 308 that is mechanically coupled to PCB 304 at one or more terminals by solder 602 joints. Capacitor 308 may include a periphery 604 defined by the lateral sides of capacitor 308. Capacitor 308 may also include a top surface and a bottom surface, and the bottom surface may be nearest to PCB 304. Since solder 602 may have a thickness in the upward direction perpendicular to the top surface of PCB 304, a gap 606 may be located between the bottom surface of capacitor 308 and the top surface of PCB 304.

In an embodiment, baffle 310 includes a damping layer 608 covering capacitor 308 and/or at least one other electronic component 306. That is, although only capacitor 308 is shown, damping layer 608 may be continuous over the top surface of PCB 304 to cover other electronic components 306 in an area broken out of FIG. 6. Damping layer 608 may be attached to the top surface of PCB 304 around the electronic components 306. More particularly, damping layer 608 may be attached to PCB 304 around electronic components 306, and may also be attached to PCB 304 at locations laterally between the electronic components 306. Thus, damping layer 608 may substantially or entirely fill the space between respective peripheries 604 of laterally offset electronic components 306. Furthermore, damping layer 608 may cover the top surfaces of the electronic components 306 such that the electronic components 306 are encapsulated between damping layer 608 and PCB 304. For example, a thickness of damping layer 608 may be greater than a height of capacitor 308 (a distance between the top surface of capacitor 308 and the top surface of PCB 304). Furthermore, the thickness of damping layer 608 may be greater than a height of all the electronic components 306 that baffle 310 covers, such that damping layer 608 provides a minimum encapsulation of 0.2 mg of damping material over each electronic component 306. In an embodiment, damping layer 608 may provide a minimum thickness of 0.1 mm of damping material over each electronic component 306. Capacitor 308 may be considered to be encapsulated even though gap 606 may remain between the bottom surface of capacitor 308 and the top surface of PCB 304. More particularly, damping layer 608 material may or may not fill gap 606 underneath capacitor 308. Thus, capacitor 308 may be considered to be encapsulated when every side but the bottom is covered by damping layer 608. In an embodiment, however, damping layer 608 fills gap 606 to form an underfill portion of damping layer 608 between capacitor 308 and PCB 304.

A single damping layer 608 covering electronic components 306 and the PCB 304 surface on which the electronic components 306 are mounted may function as both a moisture barrier and an acoustic damping mechanism. In an embodiment, damping layer 608 may be formed from an epoxy, silicone, or other polymers having water resistant properties. For example, damping layer 608 may include an encapsulation material formulated from a low glass transition temperature material designed to provide a flexible encapsulation for components on PCB 304. Thus, moisture in the housing cavity surrounding PCB assembly 302 may be unable to pass through damping layer 608 to capacitor 308 or other covered electronic components 306.

In addition to waterproofing PCB assembly 302, a single damping layer 608 may provide a damping effect by altering the bulk vibrational characteristics of PCB assembly 302. For example, the composite structure of damping layer 608 attached to PCB 304 may reduce the flexural wave speed of PCB assembly 302. Acoustic noise radiation is related to the flexural wave speed of the PCB assembly 302, and more particularly, acoustic noise radiation of the PCB assembly 302 depends on the ratio of the flexural wave speed of damping layer 608 as compared to the flexural wave speed of PCB 304. When damping layer 608 has a flexural wave speed that is less than the flexural wave speed of PCB 304, the acoustic noise radiation from PCB assembly 302 may be reduced. Flexural wave speed of the assembly components depends on several parameters, and thus, the structure of these components may be manipulated in several manners to achieve the desired ratio and concomitant noise reduction.

The flexural wave speeds of PCB assembly components are directly proportional to their respective flexural modulus. Accordingly, in an embodiment, damping layer 608 includes a flexural modulus that is lower than a flexural modulus of PCB 304. For example, PCB 304 may include a flexural modulus in a range of 3 to 30 GPa. By contrast, damping layer 608 may include a flexural modulus below that of PCB 304. For example, the flexural modulus of damping layer 608 may be at least 20% lower than the flexural modulus of PCB 304. By way of example, the flexural modulus of damping layer 608 may be in a range of 0.001 to 2.4 GPa.

Another critical parameter in determining the flexural wave speed of damping layer 608 and PCB 304 is the density of those PCB assembly components. More particularly, the flexural wave speed of damping layer 608 and the flexural wave speed of PCB 304 is inversely proportional to the density of the respective components. Accordingly, in an embodiment, damping layer 608 includes a density that is higher than a density of PCB 304. For example, PCB 304 may include a density in a range of 0.5 to 3 g/cm³. By contrast, damping layer 608 may include a density above that of PCB 304. For example, the density of damping layer 608 may be at least 10% higher than the density of PCB 304. By way of example, the density of damping layer 608 may be in a range of 0.6 to 3.5 g/cm³.

In reality, the flexural wave speed of a PCB assembly component is determined by a complex relationship between not only density and flexural modulus, but also other parameters such as a thickness of the respective component. Thus, one skilled in the art would understand that particular relationships of these parameters may be critical to controlling the flexural wave speed. In an embodiment, a ratio of the flexural modulus to the density of each assembly component may be controlled to reduce acoustic radiation. For example, a ratio of the flexural modulus to the density of damping layer 608 may be lower than a ratio of the flexural modulus to the density of PCB 304 layer. For example, the predetermined ratio for PCB 304 may be in a range of 1 to 60 GPa/(g/cm³). By contrast, the predetermined ratio for damping layer 608 may be at least 20% lower than the ratio for PCB 304. By way of example, the predetermined ratio for damping layer 608 may be in a range of 0.0001 to 0.8 GPa/(g/cm³).

Figure 7:
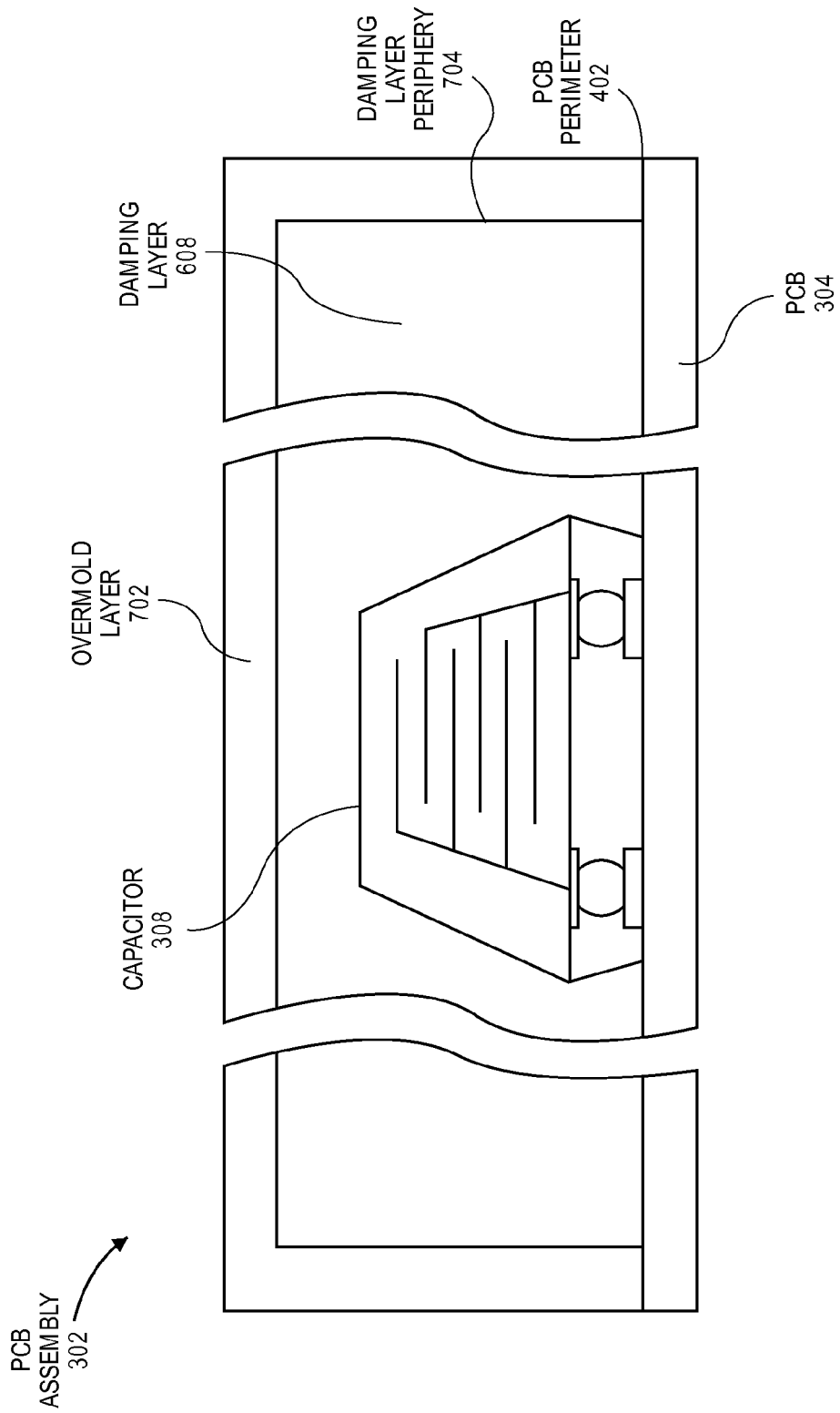
FIG. 7 is a sectional view, taken about line B-B of FIG. 3, of a PCB assembly having an overmold layer and a damping layer covering several electronic components in accordance with an embodiment.

Referring to FIG. 7, a sectional view, taken about line B-B of FIG. 3, of a PCB assembly having an overmold layer and a damping layer covering several electronic components is shown in accordance with an embodiment. Baffle 310 may include at least two layers of material covering one or more electronic components 306. Baffle 310 may include damping layer 608 covering capacitor 308 and/or other electronic components 306, as described above with respect to FIG. 6. In an embodiment, baffle 310 further includes an overmold layer 702 covering all or most of damping layer 608. More particularly, overmold layer 702 may cover damping layer 608 and be attached to PCB 304 at one or more locations around a central portion of damping layer 608, which covers several electronic components 306. For example, overmold layer 702 may extend over a top surface of damping layer 608 and surround a damping layer periphery 704 to attach to PCB 304 at or near PCB perimeter 402.

In an embodiment, overmold layer 702 provides waterproofing to prevent the ingress of moisture into damping layer 608 and electronic components 306 covered by damping layer 608. Accordingly, overmold layer 702 may be formed from a silicone or epoxy material having water resistant properties. Given that overmold layer 702 fulfills a waterproofing function, damping layer 608 may be formed from a material that fulfills a noise reduction function, but not necessarily a waterproofing function. For example, damping layer 608 may be formed from a viscoelastic damping material that does or does not provide a barrier to water migration. More particularly, damping layer 608 material may be chosen based upon its effect of reducing vibrations of PCB assembly 302, while overmold layer 702 material may be chosen based upon its ability to restrict the passage of moisture toward PCB 304.

Overmold layer 702 may cover the entirety of damping layer 608, and in addition, overmold layer 702 may cover an entire top surface of PCB 304 as shown in FIG. 7. In addition to covering damping layer 608, however, overmold layer 702 may also constrain damping layer 608 against PCB 304. For example, overmold layer 702 may be deposited directly onto damping layer 608 during a manufacturing process such that an inner (or bottom) surface of overmold layer 702 is in direct contact with an outer (or top) surface of damping layer 608. Furthermore, as described above, overmold layer 702 may surround damping layer periphery 704 to attach directly to PCB 304 and form a shell around damping layer 608. Thus, material strains such as expansions of damping layer 608 may be resisted by overmold layer 702, which presses against damping layer 608 as it tries to expand. By constraining damping layer 608, overmold layer 702 may further reduce acoustic radiation because it does not allow the damping material to expand, which may disrupt natural vibration modes in damping layer 608.

In an embodiment, overmold layer 702 is formed from a more rigid material than damping layer 608 to facilitate the constraint of damping layer 608. More particularly, overmold layer 702 may include a flexural modulus higher than the flexural modulus of damping layer 608. For example, overmold layer 702 may include a flexural modulus in a range of 0.02 to 30 GPa. By contrast, damping layer 608 may include a flexural modulus less than that of overmold layer 702. For example, the flexural modulus of damping layer 608 may be at least 10% lower than the flexural modulus of overmold layer 702. By way of example, the flexural modulus of damping layer 608 may be in a range of 0.001 to 2.4 GPa.

As described above, damping layer 608 may be formed from a viscoelastic material. In fact, damping layer 608 may be formed from any material having the requisite damping properties. More particularly, in an embodiment, damping layer 608 is formed from a material having a damping loss factor that reduces acoustic noise radiation from PCB 304. Damping layer 608 may include a damping loss factor of at least 0.01 over a frequency range of 20 Hz to 20 kHz. For example, damping loss may be in a range of 0.01 to 1. In an embodiment, the damping loss factor of damping layer 608 may be higher than a damping loss factor of overmold layer 702, such that damping layer 608 provides more damping of acoustic noise radiation than overmold layer 702.

Figure 8:
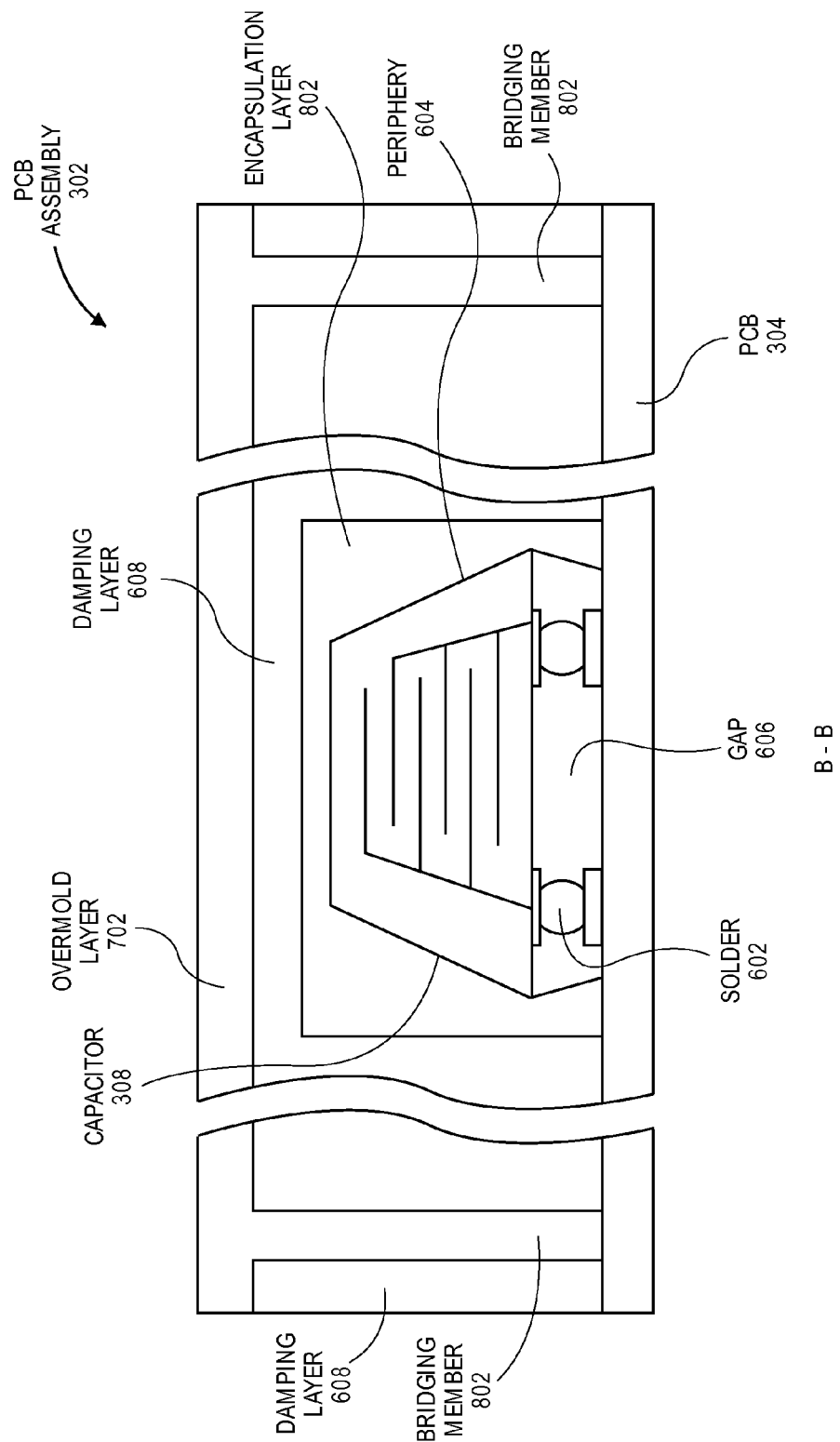
FIG. 8 is a sectional view, taken about line B-B of FIG. 3, of a PCB assembly having an overmold layer and a damping layer covering several electronic components, including at least one encapsulated capacitor, in accordance with an embodiment.

Referring to FIG. 8, a sectional view, taken about line B-B of FIG. 3, of a PCB assembly having an overmold layer and a damping layer covering several electronic components, including at least one encapsulated capacitor, is shown in accordance with an embodiment. In addition to overmold layer 702 and/or damping layer 608 covering electronic components 306 mounted on PCB 304, each electronic component 306 of PCB assembly 302 may also be covered by a respective encapsulation layer 802. For example, encapsulation layer 802 may cover capacitor 308 and be disposed between damping layer 608 and PCB 304. More particularly, encapsulation layer 802 may surround periphery 604 of capacitor 308 and/or cover the top surface of capacitor 308. Encapsulation layer 802 may cover the entire capacitor 308, such that capacitor 308 is encapsulated between encapsulation layer 802 and PCB 304. Similar to the single damping layer 608 described above, however, encapsulation layer 802 may not fill gap 606 below capacitor 308. In an embodiment, however, encapsulation layer 802 fills gap 606 and including an underfill portion between capacitor 308 and PCB 304.

Encapsulation layer 802 may serve as a moisture barrier and may also serve as an energy absorber. More particularly, encapsulation layer 802 may be attached to the top surface of PCB 304 to form a shell around capacitor 308 similar to the manner in which overmold layer 702 forms a shell around damping layer 608. As such, encapsulation layer 802 may constrain capacitor 308 by increasing a mechanical coupling between capacitor 308 and PCB 304. Encapsulation layer 802 may itself be encapsulated within damping layer 608 and/or overmold layer 702. That is, one or both of damping layer 608 or overmold layer 702 may surround the sides of encapsulation layer 802, and as such, may also surround periphery 604 of capacitor 308.

To avoid moisture capture, encapsulation layer 802 may be formed from a water barrier material. For example, encapsulation layer 802 may be formed from silicone, epoxy, or other materials having water resistant or waterproof properties. Encapsulation layer 802 may nonetheless be formed from a material that absorbs vibrational energy from electronic components 306. In an embodiment, encapsulation layer 802 has a lower flexural modulus than the flexural modulus of PCB 304. For example, PCB 304 may include a flexural modulus in a range of 3 to 30 GPa. By contrast, encapsulation layer 802 may include a flexural modulus less than that of PCB 304. For example, the flexural modulus of encapsulation layer 802 may be at least 10% lower than the flexural modulus of PCB 304. By way of example, the flexural modulus of encapsulation layer 802 may be in a range of 0.01 to 5 GPa. Accordingly, encapsulation layer 802 may have a lower flexural wave speed than PCB 304, and a damping effect on acoustic noise radiation.

In an embodiment, encapsulation layer 802 has a lower flexural modulus than the flexural modulus of overmold layer 702. For example, overmold may include a flexural modulus in a range of 0.02 to 30 GPa. By contrast, encapsulation layer 802 may include a flexural modulus less than that of overmold layer 702. For example, the flexural modulus of encapsulation layer 802 may be at least 10% lower than the flexural modulus of overmold layer 702. By way of example, the flexural modulus of encapsulation layer 802 may be in a range of 0.01 to 5 GPa. Accordingly, encapsulation layer 802 may have a lower flexural wave speed than overmold layer 702.

Although not shown in FIG. 8, multiple electronic components 306, e.g., multiple capacitors 308, may be encapsulated by respective encapsulation layers 802. For example, another capacitor 308 may be mounted on PCB 304 in the broken out section of FIG. 8, and another encapsulation layer 802 may form a thin encapsulation film around the other capacitor 308. Thus, damping layer 608 may be disposed laterally between the multiple electronic components 306, and more particularly, may be disposed in the lateral space between the respective encapsulation layers 802 that cover the electronic components 306.

In an embodiment, overmold layer 702 does not surround one or more sides of damping layer 608. Overmold layer 702 may nonetheless substantially constrain damping layer 608 against PCB 304. For example, overmold layer 702 may cover all or most of the top surface of damping layer 608 and be attached to PCB 304 at several locations around the covered electronic components 306 to apply a constraining force to the top surface in a normal direction relative to PCB 304. The constraining force may press downward on damping layer 608 over the covered electronic components 306.

One or more bridging members 802 may provide an attachment between overmold layer 702 and PCB 304. For example, bridging member 802 may be an elongated protrusion extending from the inner (or bottom) surface of overmold layer 702 to the top surface of PCB 304. The protrusion may be attached to PCB 304 in a number of ways, including by adhesive bonds, mechanical couplings, or snap fit features. Thus, bridging members 802 may retain overmold layer 702 at a fixed distance from PCB 304, even when damping layer 608 attempts to expand due to deformation of electronic components 306. Accordingly, overmold layer 702 and PCB 304 essentially form an enclosure around damping layer 608 and electronic components 306, albeit without necessarily surrounding the sides of damping layer 608. That is, as shown in FIG. 8, damping layer 608 may extend laterally around bridging members 802 such that the sides of damping layer 608 meet with PCB perimeter 402 and bridging members 802 are encapsulated by damping layer 608 material between overmold layer 702 and PCB 304.

Bridging members 802 may have several configurations. In an embodiment, bridging members 802 are integrally formed with overmold layer 702 such that bridging members 802 extend continuously from a bottom surface of overmold layer 702 toward PCB 304. For example, bridging members 802 may be formed with overmold layer 702 in a same overmolding process operation. Alternatively, bridging members 802 may be separate components, including stanchions, posts, or other standoffs, that may be affixed to overmold layer 702 at one end and to PCB 304 at another end in order to fasten and physically connect those components together.

Figure 9:
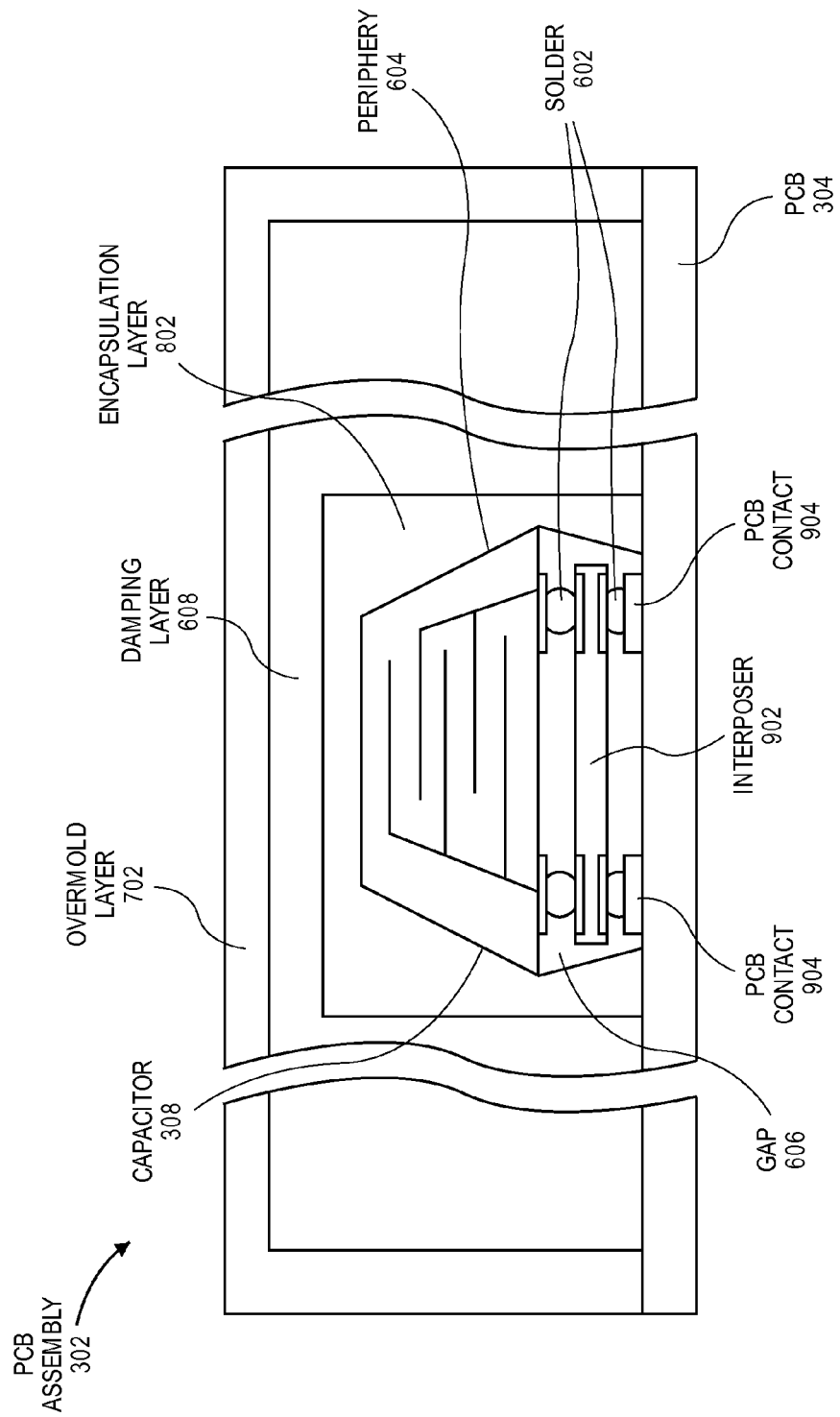
FIG. 9 is a sectional view, taken about line B-B of FIG. 3, of a PCB assembly having a damping layer covering several electronic components, including at least one encapsulated capacitor mounted on an interposer, in accordance with an embodiment.

Referring to FIG. 9, a sectional view, taken about line B-B of FIG. 3, of a PCB assembly having a damping layer covering several electronic components, including at least one encapsulated capacitor mounted on an interposer, is shown in accordance with an embodiment. Baffle 310 having one or more layers, such as overmold layer 702, damping layer 608, or encapsulation layer 802, may reduce acoustic noise radiation from PCB assembly 302 by preventing passage of acoustic waves from electronic components 306 and by modifying the bulk vibrational characteristics of PCB assembly 302 to reduce acoustic noise radiation. In particular, surrounding periphery 604 of capacitors 308 and constraining capacitors 308 against PCB 304, while also lowering a flexural wave speed of PCB assembly 302, provides a damping effect to PCB assembly 302. In an embodiment, a damping effect is also achieved by reducing or eliminating vibration transmitted from capacitor 308 to PCB 304.

In an embodiment, an interposer 902 is disposed in gap 606 between capacitor 308 and PCB 304. More particularly, interposer 902 may include a structure that conveys electrical signals from PCB 304 to capacitor 308, but is impervious or does not deform as much as capacitor 308, when the electrical signals include voltage ripples. Interposer 902 may be rigidly attached to capacitor 308 and PCB 304 in numerous manners. For example, interposer 902 may be mechanically coupled to one or more PCB contacts 904 on PCB 304, and may also be mechanically attached to electrical terminals of capacitor 308. Attachments may include solder 602 joints to affix the components and to allow the components to communicate electrically with one another. In an embodiment, although the attachments between interposer 902 and capacitor 308 or PCB 304 may be rigid, interposer 902 may include a structure that nonetheless provides a damping effect and reduces the transmission of vibrations from a noisy capacitor 308 to PCB 304.

Figure 10:
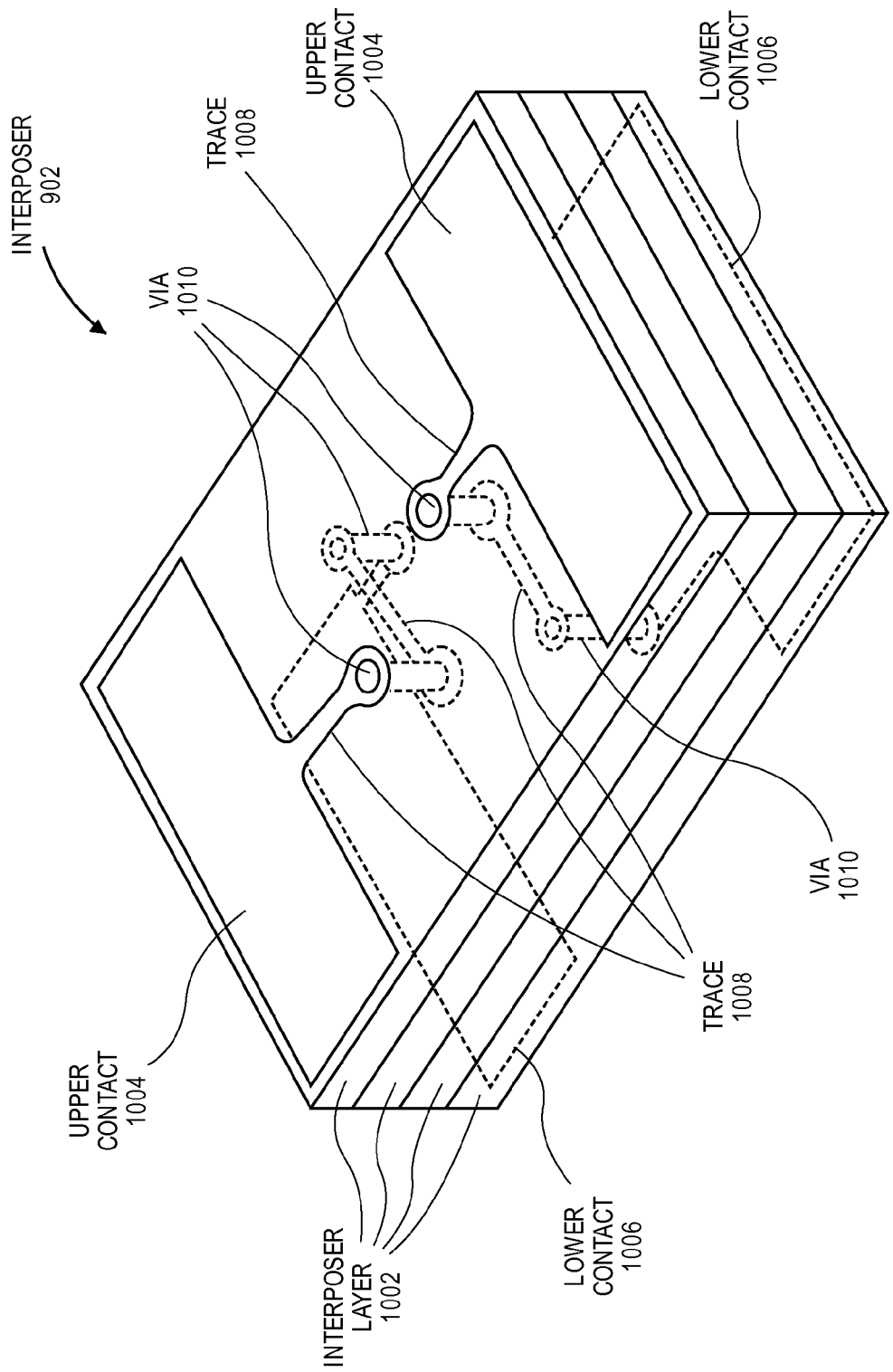
FIG. 10 is a perspective view of an interposer in accordance with an embodiment.

Referring to FIG. 10, a perspective view of an interposer is shown in accordance with an embodiment. Interposer 902 may include one or more interposer layers 1002 arranged in an essentially flat configuration and laminated one on top of another. Interposer layers 1002 may be nonconductive, i.e., insulating. For example, interposer layers 1002 may be formed from glass fibers interwoven within an epoxy binder. In other words, interposer layers 1002 may have a similar structure to the insulating layers of PCB 304. In an embodiment, interposer layers 1002 include an epoxy, however, no glass fibers are interwoven within the epoxy. Thus, interposer 902 and interposer layers 1002 may include a flexural modulus lower than the substrate of PCB 304. By way of example, interposer layers 1002 may be formed from polyimide film, liquid photoimageable coverlay (LPI), acrylic, epoxy glass, or polyimide-glass. A flexural modulus of interposer layers 1002 may be in a range of 0.01-2.1 GPa. More particularly, the flexural modulus of interposer 902 may be at least 30% lower than the flexural modulus of PCB 304.

In an embodiment, the flexural wave speed of interposer 902 may be less than the flexural wave speed of PCB 304. Thus, as discussed above, other parameters besides flexural modulus may be modified to achieve this relationship. For example, a density of interposer 902 may be higher than the density of PCB 304. Furthermore, a thickness of interposer 902 may be greater than a thickness of PCB 304. Interposer 902 may have a specific thickness selected such that interposer 902 acts as a non-rigid acoustically insulating barrier between capacitor 308 and PCB 304. The thickness of PCB 304 may typically be in a range of 0.005-inch to 0.038-inch, and thus, a thickness of interposer 902 may be in a range of 0.001-inch to 0.010-inch.

In addition to reducing transmission of mechanical vibrations from a noisy capacitor 308 to PCB 304, interposer 902 may also provide an electrical connection between contacts on capacitor 308 and PCB 304. In an embodiment, interposer 902 includes one or more upper contact 1004 on a top face. Upper contacts 1004 may be located on the top face to directly oppose terminals on capacitor 308. Similarly, interposer 902 may include one or more lower contacts 1006 on a bottom face. Lower contacts 1006 may be located to directly oppose PCB contacts 904 on the top surface of PCB 304. Upper contacts 1004 and lower contacts 1006 may be formed from conductive materials, such as copper foils that have not been etched away on the top and bottom faces in order to maintain an electrically conductive contact surface.

Each upper contact 1004 may be electrically connected to a respective lower contact 1006 through one or more electrical trace 1008 and/or electrical via 1010. Such electrical connections are well-known in the art. For example, vias are commonly used to make electrical connections between layers in a printed circuit of a PCB, and traces are commonly used to make electrical connections and conduct signals along the planar surfaces of layers in a printed circuit of a PCB. Dimensions, including the width and thicknesses of traces 1008 and vias 1010, may be varied depending on the electrical signals, power, or current that the electrical connections are required to carry. Traces 1008 and vias 1010 are formed from a metal, and thus, may be stiffer than materials used to form interposer layers 1002. Nonetheless, the volume occupied by traces 1008 and vias 1010 may be less than a corresponding volume occupied by traces and vias in a portion of PCB 304 under interposer 902. Furthermore, in an embodiment, vias 1010 and traces 1008 may be routed to help maximize the compressibility of interposer 902 to absorb vibrational energy from a noisy capacitor 308.

Interposer 902 may include upper contact 1004 and lower contacts 1006 located laterally outward from vias 1010. More particularly, vias 1010 may include two or more via segments 1102, and at least one via segment may be located nearer to a center of interposer 902 than either upper contact 1004 or lower contact 1006. As shown, vias 1010 may have segments that respectively drop through one or more interposer layers 1002. Furthermore, the segments may be interconnected by traces 1008 such that the combination of segments of via 1010 drop from a top face of interposer 902 to a bottom face of interposer 902. In an embodiment, the segments of via 1010 are located closer to a center of interposer 902 than upper contact 1004 and lower contacts 1006. More particularly, the segments of via 1010 may be laterally offset from upper contact 1004 and lower contacts 1006 such that no segments reside directly between the contacts. A structural effect of this routing is to make the interposer 902 more rigid within its center region than at its lateral edges. More particularly, interposer 902 may be more compressible between upper contact 1004 and lower contact 1006 than between the upper face and the lower face at the central region having vias 1010 and traces 1008. Accordingly, vibrations of a noisy capacitor 308 are absorbed by the interposer layer 1002 material between upper contacts 1004 and lower contacts 1006.

Figure 11:
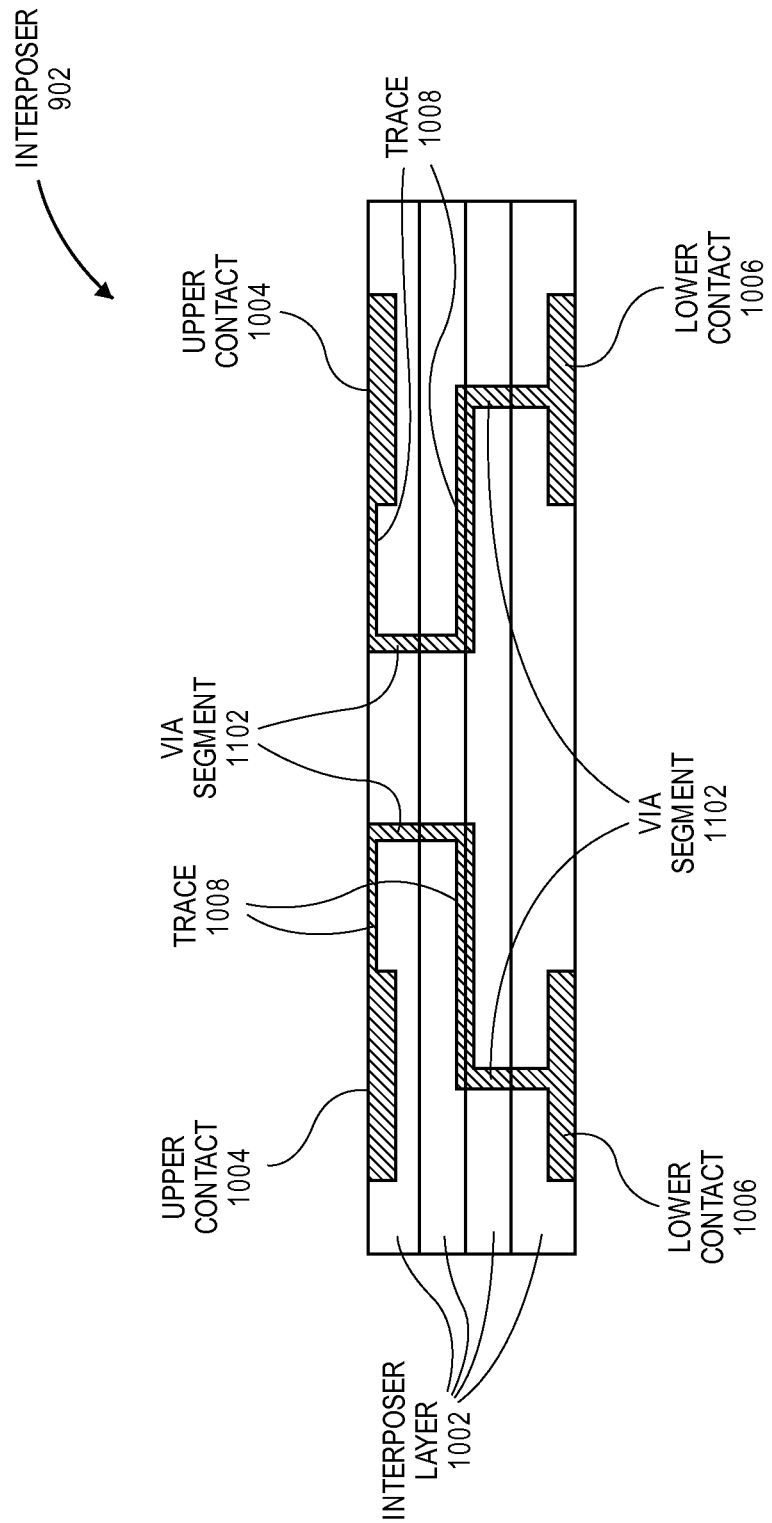
FIG. 11 is a sectional view of an interposer having via segments laterally offset from electrical contacts in accordance with an embodiment.

Referring to FIG. 11, a sectional view of an interposer having via segments laterally offset from electrical contacts is shown in accordance with an embodiment. Referring now to the electrical connection between the top face and the bottom face of the left side of interposer 902 shown in FIG. 11, a first trace 1008 may be routed transversely from upper contact 1004 to an upper end of via segment 1102, along the top face of interposer 902. The upper end of via segment 1102 may be more centrally located than upper contact 1004. Via segment 1102 may then drop down, e.g., through the top two interposer layers 1002, to a lower end connected to a trace 1008 sandwiched between interposer layers 1002 within interposer 902. The trace 1008 within interposer 902 may be routed laterally toward a side of interposer 902 away from the centrally located via segment 1102. The laterally routed trace 1008 may terminate at another via segment 1102 located above the lower contact 1006, and that via segment 1102 may drop down through one or more interposer layers 1002 to connect to lower contact 1006. Thus, in the electrical connection shown in FIG. 11, at least one via segment 1102 may be located nearer to the center of interposer 902 than either upper contact 1004 or lower contact 1006.

Figure 12:
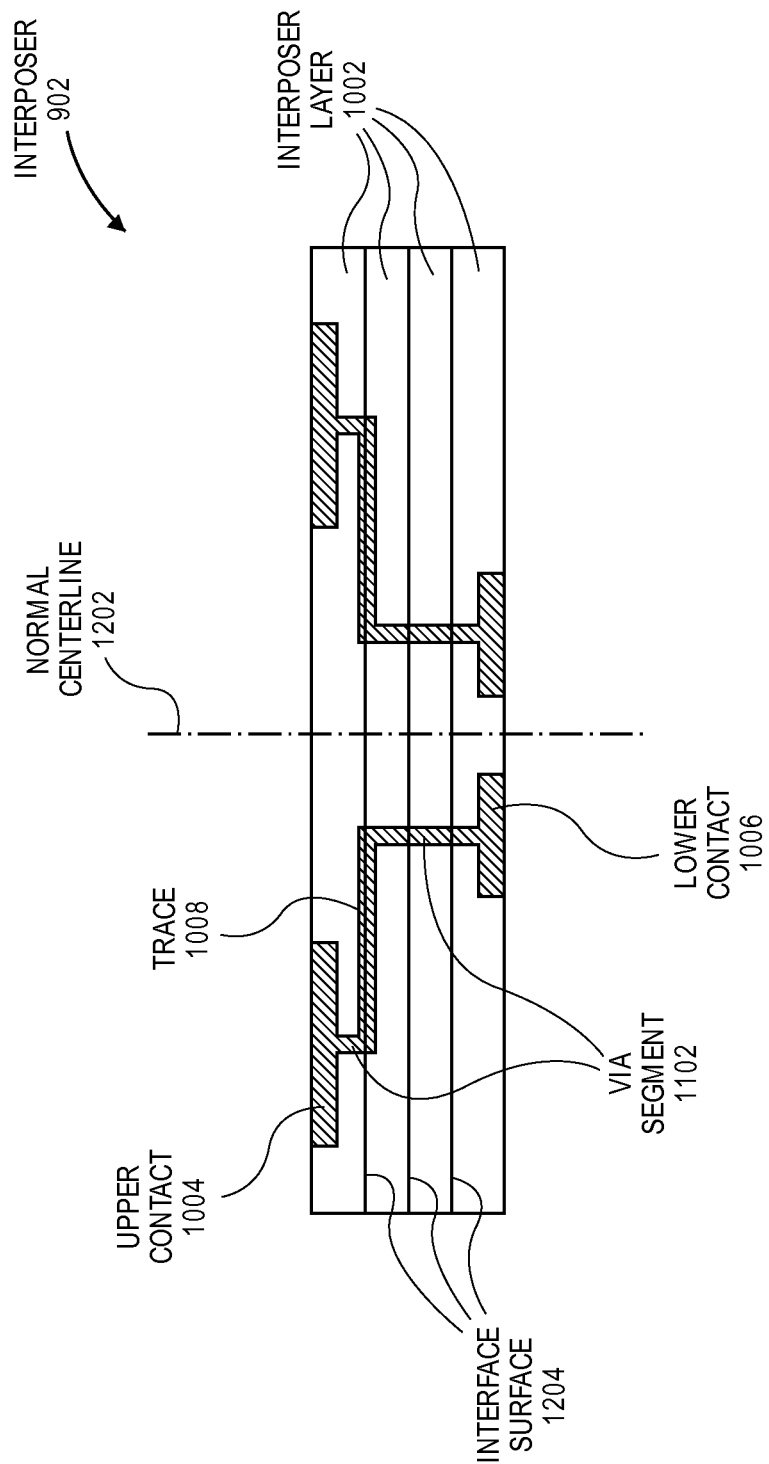
FIG. 12 is a sectional view of an interposer having via segments and electrical contacts laterally offset from other electrical contacts in accordance with an embodiment.

Referring to FIG. 12, a sectional view of an interposer having via segments and electrical contacts laterally offset from other electrical contacts is shown in accordance with an embodiment. In an embodiment, upper contact 1004 and lower contact 1006 of interposer 902 are laterally offset from one another. For example, upper contact 1004 may be located nearer to an outer limit, i.e., a periphery, of interposer 902, while lower contact 1006 may be located nearer to a normal centerline 1202 extending in a direction perpendicular to the top face of interposer 902. Furthermore, one via segment 1102 may extend from upper contact 1004 downward through one or more interface layer and another via segment 1102 may extend upward from lower contact 1006 through one or more interposer layers 1002. Thus, the via segment 1102 extending from upper contact 1004 may be laterally offset from lower contact 1006, and the via segment 1102 extending upward from lower contact 1006 may be laterally offset from upper contact 1004. Likewise, the via segment 1102 extending downward from the top face of interposer 902 may be laterally offset from the via segment 1102 extending upward from the bottom face of interposer 902.

Interposer layers 1002 may be laminated upon one another, and thus, one interposer layer 1002 may have a bottom surface facing a top surface of an adjacent interposer layer 1002. More particularly, the facing surfaces may be in contact with an intermediate interface surface 1204. Thus, in the case of interposer 902 having two interposer layers 1002, a single interface surface 1204 may exist between the layers. Similarly, in an interposer 902 having four interposer layers 1002, three interface surfaces 1204 may exist between the layers, as shown. In an embodiment, interface surfaces 1204 include a conductive material, e.g., a copper film, disposed on interposer layers 1002 to allow for electrical connections to be formed. That is, interface surfaces 1204 may be etched conductive film to form one or more trace 1008 extending along a surface of interposer layers 1002. As shown, trace 1008 may extend along interface surface 1204 between via segment 1102 connected to upper contact 1004 and via segment 1102 connected to lower contact 1006. Interface surfaces 1204 may be formed by etching to generate any desired printed circuit on respective interposer layers 1002. Thus, interposer 902 may be formed with laterally offset via segments 1102, i.e., via segments 1102 laterally offset from one another and/or via segments 1102 laterally offset from upper contacts 1004 or lower contacts 1006. By staggering the via segments 1102 away from capacitor terminations, interposer 902 becomes more flexible such that interposer 902 material directly under the terminations can absorb energy and reduce the transmission of vibration from capacitor 308 to PCB 304.

Figure 13:
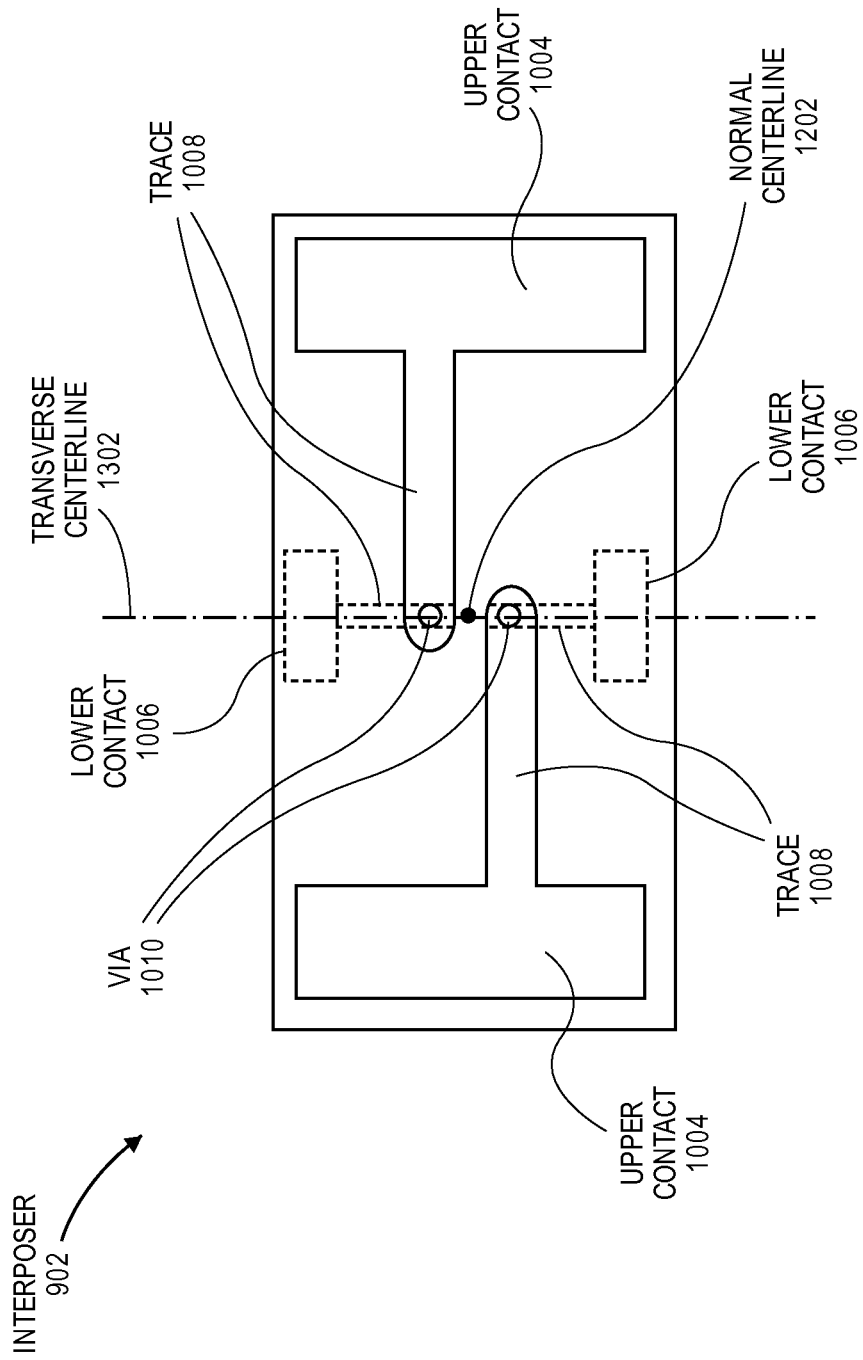
FIG. 13 is a top view of an interposer having centrally located electrical contacts in accordance with an embodiment.

Referring to FIG. 13, a top view of an interposer having centrally located electrical contacts is shown in accordance with an embodiment. Interposer 902 may include vias 1010 laterally offset from upper contacts 1004 and capacitor terminations. Vias 1010 may be connected to lower contacts 1006 through traces 1008 such that lower contacts 1006 are as close as possible to a transverse centerline 1302 of interposer 902. Referring to the leftmost upper contact 1004 shown, trace 1008 may extend laterally along the top face of interposer 902 from upper contact 1004 to transverse centerline 1302, which may run along a plane extending transversely through a middle of interposer 902 and oriented perpendicular to the top face of interposer 902. A via 1010 connected with the leftmost upper contact 1004 and a via 1010 connected with the rightmost upper contact 1004 may both be arranged along transverse centerline 1302, however, the vias 1010 may be transversely offset near normal centerline 1202 passing perpendicular to the top face of interposer 902. That is, one via 1010 may be transversely offset on one side of normal centerline 1202 and the other via 1010 may be transversely offset on another side of normal centerline 1202. In an embodiment, the vias 1010 extend downward from a top face of interposer 902 through interposer layers 1002 to the bottom face of interposer 902. Thus, each via 1010, rather than having multiple via segments 1102, may be a single connector in the direction perpendicular to the interposer 902 faces. A bottom end of the vias 1010 may be connected to respective lower contacts 1006 by traces 1008 (shown with hidden lines in FIG. 13) running along the bottom face of interposer 902 in the transverse direction (in the direction of transverse centerline 1302). That is, trace 1008 may interconnect a bottom end of via 1010 with lower contact 1006 positioned at the middle of interposer 902 along transverse centerline 1302. More particularly, lower contacts 1006 may reside at the middle of interposer 902, which may also be a location that coincides with a middle of capacitor 308.

Still referring to FIG. 13, a transverse separation distance between vias 1010 and or lower contacts 1006 along transverse centerline 1302 may be determined based on manufacturability. For example, lower contacts 1006 may be located adjacent to transverse edges of the lower face of interposer 902 such that the contacts are separated as much as possible along transverse centerline 1302. In another embodiment, however, lower contacts 1006 may reside at the center of interposer 902 below the center of capacitor 308, in a side-by-side configuration. That is, lower contacts 1006 may be located on the lower face of interposer 902 directly below vias 1010, so long as lower contacts 1006 are separated by a distance to allow for reliable etching of the conductive films on interposer 902 and to prevent electrical shorting between the lower contacts 1006 and/or PCB contacts 904 to which the lower contacts 1006 connect. By making the final interconnection between lower contacts 1006 and PCB contacts 904 at a location near the middle of capacitor 308, the final interconnections will be within a region exposed to the least acoustic noise, and thus may benefit from reduced mechanical strain and transmit less acoustic vibration to PCB 304.

Figure 14:
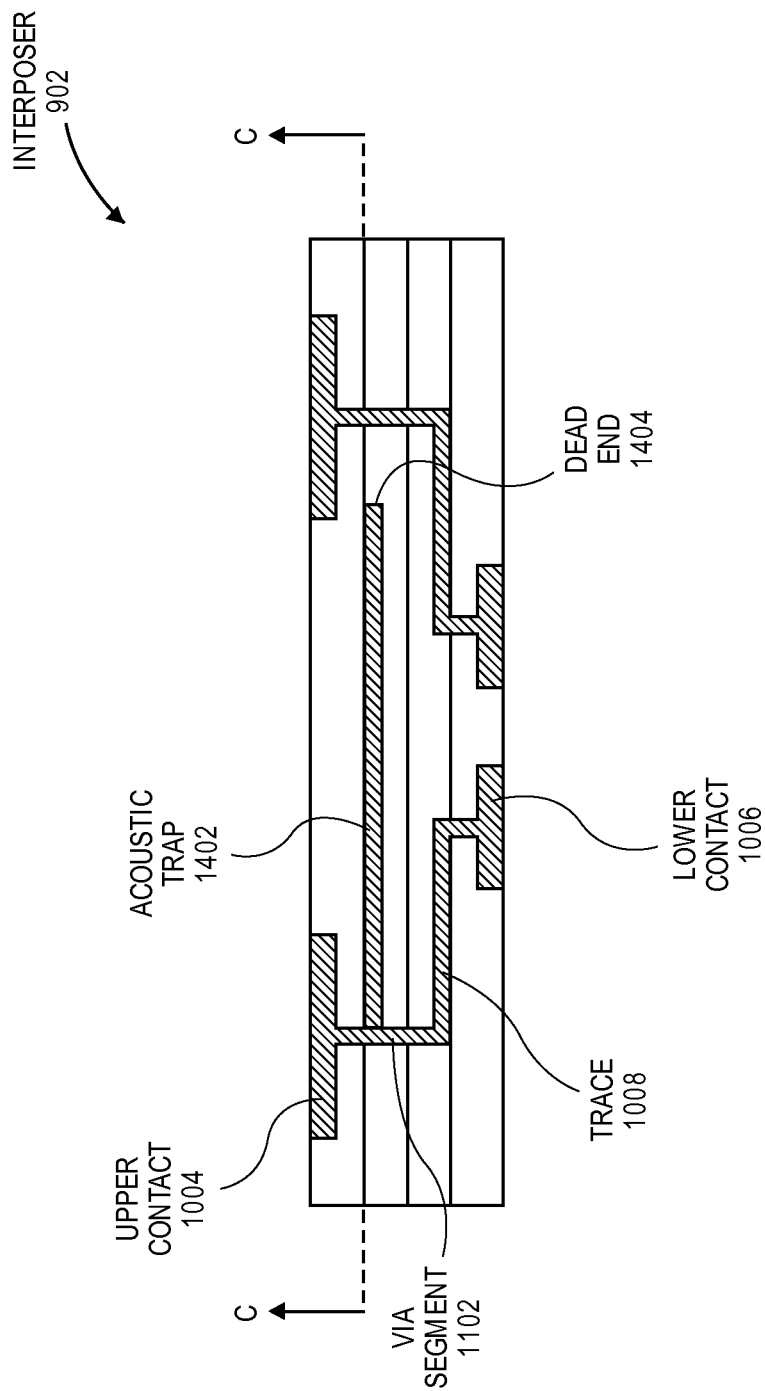
FIG. 14 is a sectional view of an interposer having an acoustic trap in accordance with an embodiment.

Referring to FIG. 14, a sectional view of an interposer having an acoustic trap is shown in accordance with an embodiment. As described above, interposer 902 may include electrical connections having upper contact 1004, lower contact 1006, via segments 1102, or traces 1008, to electrically connect capacitor 308 mounted on upper contacts 1004 to PCB 304 on which interposer 902 is mounted. The laterally offset contacts and/or via segments 1102 may reduce the transmission of vibration from capacitor 308 to PCB 304, as discussed above. Vibrational acoustics, however, may nonetheless be generated by a noisy capacitor 308, and more particularly, acoustic waves may radiate toward PCB 304 from capacitor 308. To prevent these acoustic waves from reaching PCB 304, interposer 902 may include an acoustic trap 1402 to trap and/or reflect the acoustic waves away from PCB 304. Acoustic trap 1402 may be a quarter wave acoustic trap placed along a path of the electrical connection between upper contact 1004 and lower contact 1006. More particularly, acoustic trap 1402 may be formed from one or more trace 1008 or via 1010 extending from via segment 1102 or trace 1008 between the interposer contacts. Although acoustic trap 1402 may be formed from conductive material such as copper film or metallic via material, acoustic trap 1402 may not form a circuit, and thus, acoustic trap 1402 may not interconnect electrical components of interposer 902. That is, a first end (start location) of acoustic trap 1402 may be located at via segment 1102 or trace 1008, but a second end of acoustic trap 1402 may be a dead end 1404, i.e., may not be connected to a separate component. In an embodiment, the start location is also separated from the electrical connection running through interposer 902. Thus, acoustic trap 1402 may be an acoustic element, not an electrical element.

Figure 15:
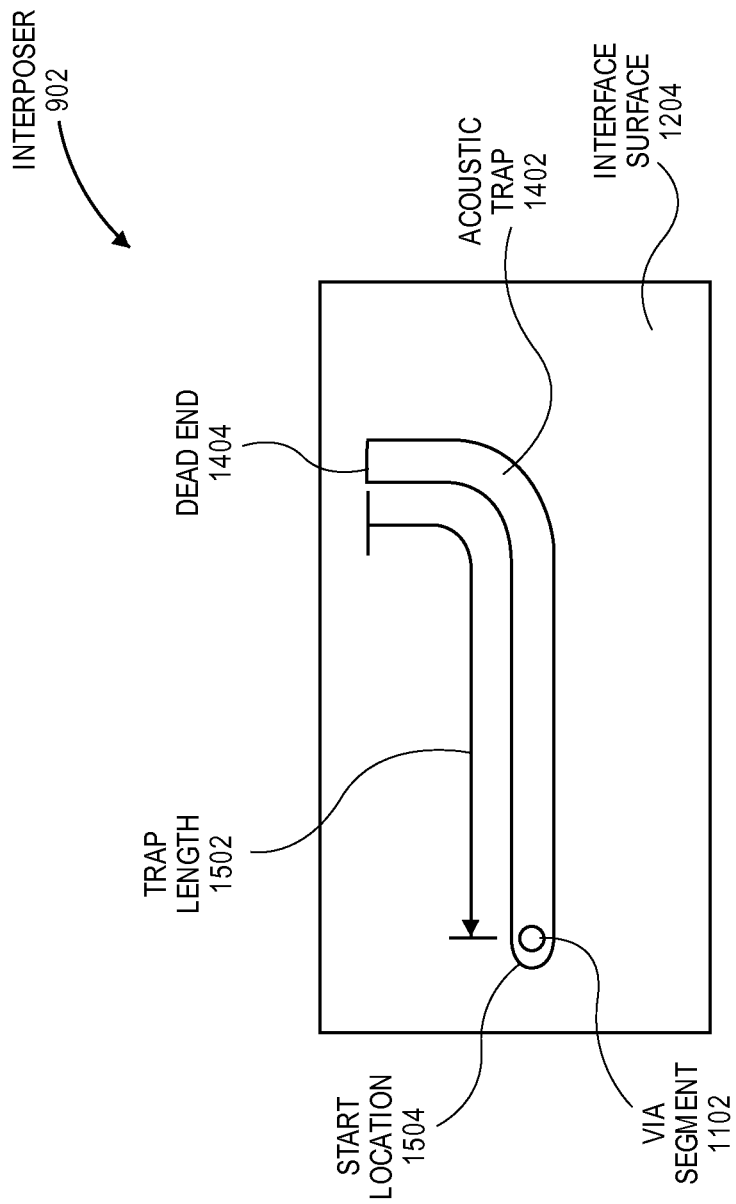
FIG. 15 is a sectional view, taken about line C-C of FIG. 14, of an interposer having an acoustic trap in accordance with an embodiment.

Referring to FIG. 15, a sectional view, taken about line C-C of FIG. 14, of an interposer having an acoustic trap is shown in accordance with an embodiment. Acoustic trap 1402 may extend from trace 1008 or via segment 1102, and thus, acoustic trap 1402 may include horizontal trace lengths (when acoustic trap 1402 extends from via segment 1102) or vertical via lengths (when acoustic trap 1402 extends from trace 1008). As shown, a start location 1504 of acoustic trap 1402 may be located at via segment 1102 and acoustic trap 1402 may follow a path along the interface surface 1204 over trap length 1502 to dead end 1404. Acoustic trap 1402 may follow any path between start location 1504 and dead end 1404. For example, acoustic trap 1402 may include one or more linear segments and/or one or more curvilinear segments, as shown. In addition to having bends formed by curvilinear segments, linear segments may meet at a right angle to form a bend, although this is not necessarily preferred. Therefore, acoustic trap 1402 may be patterned and/or etched on interface surface 1204 in any geometry having the requisite trap length 1502 to reflect the predetermined acoustic wavelengths.

Acoustic trap 1402 of interposer 902 may trap and/or reflect acoustic waves having a wavelength that is four times a trap length 1502. Thus, trap length 1502 may be varied to prevent passage of acoustic waves having a predetermined wavelength. By way of example, capacitor 308 may emit noise predominantly at a given wavelength, such as 5 kHz, and the acoustic waves at that frequency may have a wavelength of 7 cm. Accordingly, to trap and/or reflect the acoustic waves, acoustic trap 1402 may be formed with a trap length 1502 of 1.75 cm, which is one quarter of the predetermined wavelength to be trapped. Of course, capacitor 308 may emit noise having a wide range of frequencies, and thus, interposer 902 may include one or more acoustic traps 1402 having respective trap lengths 1502 designed to reflect particular sound waves. That is, each acoustic trap 1402 may have a trap length 1502 to trap or reflect a respective predetermined wavelength. As such, the acoustic traps 1402 help ensure that multiple acoustic frequencies do not pass from capacitor 308 to PCB 304, and thus, reduce excitation of PCB 304 by the predetermined vibrational acoustics.

Figure 16:
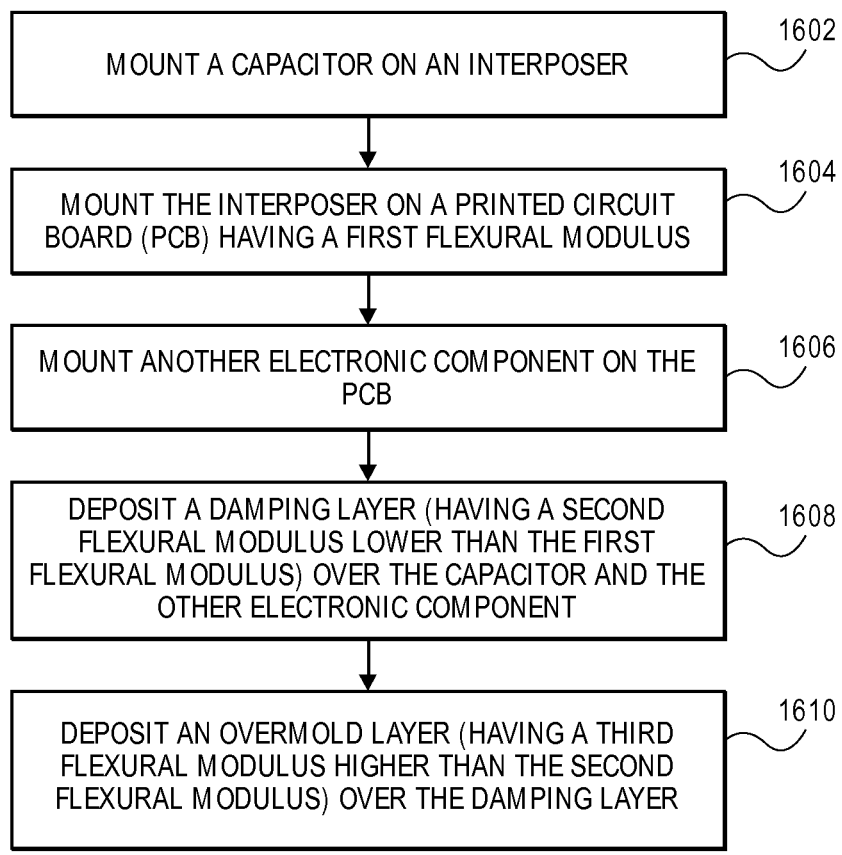
FIG. 16 is a flowchart of a method of making a PCB assembly having a baffle covering a PCB in accordance with an embodiment.

Referring to FIG. 16, a flowchart of a method of making a PCB assembly having a baffle covering a PCB is shown in accordance with an embodiment. In an embodiment, PCB assembly 302 may include baffle 310 having one or more of overmold layer 702, damping layer 608, or encapsulation layer 802, as well as interposer 902, which may or may not include acoustic trap 1402. A method of forming PCB assembly 302 having one or more of the above features may optionally begin at operation 1602, by mounting capacitor 308 on interposer 902. In an embodiment, capacitor 308 and interposer 902 may have profiles, i.e., outer peripheries viewed from above, that are the same. Alternatively, the profiles may differ and the profile of capacitor 308 may be larger than the profile of interposer 902, or vice versa. As discussed above, terminals of capacitor 308 may be bonded to upper contact 1004 of interposer 902 using solder 602. Additional joints may also be used to fasten capacitor 308 to interposer 902, for example, epoxy joints may be formed between a bottom surface of capacitor 308 and an adjacent top face of interposer 902.

At operation 1604, interposer 902 may be mounted on PCB 304. As discussed above, lower contacts 1006 of interposer 902 may be bonded to PCB contacts 904 using solder 602. Additional joints may also be used to secure interposer 902. For example, epoxy joints may be formed between a top surface of PCB 304 and an adjacent face of interposer 902. PCB 304 may include a flexural modulus, which is a critical parameter in the flexural wave speed of PCB 304.

In an embodiment, a method of making PCB assembly 302 may not include providing interposer 902 between capacitor 308 and PCB 304. For example, capacitor 308 may instead be mounted directly on PCB 304 as discussed above. In such case, solder 602 and/or epoxy joints may be formed between capacitor 308 and PCB 304. Furthermore, epoxy may be used to at least partially fill gap 606 between a bottom surface of capacitor 308 and a top surface of PCB 304.

At operation 1606, one or more additional electronic components 306 may be mounted on PCB 304. Mounting of additional electronic components 306, including processor 202, may be performed in a similar manner as that described above with respect to capacitor 308. For example, solder 602 joints may be formed between electronic components 306 and PCB contacts 904 to create a mechanical and electrical connection between electronic components 306 and PCB 304. Gap 606 between the additional electronic components 306 and PCB 304 may be filled by an epoxy or other filler.

At operation 1608, damping layer 608 may be deposited over several electronic components 306. For example, damping layer 608 may be deposited as a continuous layer to cover an entire top surface of the printed circuit assembly such that damping layer 608 covers all electronic components 306 mounted on PCB 304. Alternatively, a continuous damping layer 608 may cover a portion of the printed circuit assembly and include damping layer periphery 704 around capacitor 308 and several other electronic components 306, but the damping layer periphery 704 may be laterally inward of PCB perimeter 402. In an embodiment, damping layer 608 is formed from a viscoelastic material, such as an elastomeric material, having a viscosity that allows damping layer 608 to be flowed between electronic components 306 mounted on PCB 304. For example, damping layer 608 material may have a viscosity in a range of 10,000 to 50,000 mPa*s at 25° C. (measured using a Brookfield CP51, 2 rpm). Accordingly, damping layer 608 material may be molded in an uncontrolled manner to encapsulate electronic components 306 on PCB 304 and fill the lateral spaces between the electronic components 306. Alternatively, damping layer 608 material may be flowed over electronic components 306 using a controlled molding process, such as a dam and fill process, to form damping layer 608 and encapsulate electronic components 306 mounted on PCB 304. It has been shown that encapsulating electronic components 306 with damping layer 608 applied by a controlled dam and fill molding process results in reduced acoustic noise radiation from PCB assembly 302, however, other processes for depositing damping layer 608 onto the printed circuit assembly may be used. For example, damping layer 608 material may be deposited using injection molding, transfer molding, or spray processes to fabricate the damping layer 608 structures discussed above. Damping layer 608 may be deposited on only one side of PCB 304, such as the top surface of PCB 304. Alternatively, damping layer 608 may be deposited onto at least two sides of PCB 304, such as on both the top surface and the bottom surface of PCB 304 to encapsulate electronic components 306 above and below PCB 304.

The deposited damping layer 608 may be attached to PCB 304 around mounted electronic components 306. As discussed above, damping layer 608 may include a flexural modulus lower than the flexural modulus of PCB 304. Thus, damping layer 608 may alter the flexural wave speed of PCB assembly 302 and reduce acoustic noise radiation from PCB assembly 302. Accordingly, damping layer 608 acts as a semi-rigid acoustically insulating barrier between capacitor 308 and the inner space within housing 102.

At operation 1610, overmold layer 702 may be deposited over damping layer 608. Like damping layer 608, overmold layer 702 may be deposited using a controlled or uncontrolled molding process. For example, a dam and fill molding process may be used to form overmold layer 702 over damping layer 608. Overmold layer 702 may be attached to PCB 304 at several locations around electronic components 306 covered by damping layer 608. For example, overmold layer 702 may surround damping layer periphery 704 to attach to PCB 304, or bridge elements may extend from overmold layer 702 through a thickness of damping layer 608 to PCB 304 to form a mechanical coupling between the components. Thus, overmold layer 702 may be connected to PCB 304 at several locations around a central portion of damping layer 608. Accordingly, overmold layer 702 may constrain damping layer 608 against PCB 304 to limit expansion of the deposited damping layer 608 material and thereby reduce noise radiation. As discussed above, overmold layer 702 may include a flexural modulus higher than the flexural modulus of damping layer 608. Furthermore, the flexural modulus of overmold layer 702 may be the same or less than the flexural modulus of PCB 304. The flexural modulus of overmold layer 702 may be varied through material choice, e.g., by choosing a molding material having an intrinsic flexural modulus and/or by incorporating filler material in the overmold layer 702 material to alter the intrinsic flexural modulus. For example, fused silica may be incorporated in overmold layer 702 material to increase the flexural modulus of overmold layer 702.

Other operations may be performed to form the structural features described above. For example, in addition to depositing damping layer 608 and overmold layer 702 over the electronic components 306 on PCB 304, encapsulation layer 802 may also be deposited over individual electronic components 306. In an embodiment, encapsulation layer 802 is deposited directly on capacitor 308 to form a thin-film encapsulation around capacitor 308 and to constrain capacitor 308 against PCB 304. Electronic components 306 may be encapsulated by encapsulation layer 802 prior to depositing damping layer 608. Like damping layer 608 and overmold layer 702, encapsulation layer 802 may be deposited using controlled or uncontrolled molding processes. For example, encapsulation layer 802 may be controllably deposited over several electronic components 306 without filling the lateral space between the electronic components 306 (such that damping layer 608 may fill that space instead). Thus a viscosity of encapsulation layer 802 may be chosen to allow encapsulation layer 802 to form a thin film around capacitor 308. Furthermore, material properties such as the flexural modulus of encapsulation layer 802 and the viscosity of encapsulation layer 802 may be chosen to facilitate the molding process and to ensure that encapsulation layer 802 provides the desired waterproofing and/or noise reducing effects.

The structural features and manufacturing processes discussed above may be varied within the scope of this disclosure to achieve the desired noise reduction effect. For example, preliminary test and simulation results have shown that the noise reduction effects can be tuned and optimized by changing material properties, e.g., flexural modulus, density, or viscosity, of damping layer 608, and also by adjusting coverage, i.e., an amount of the printed circuit assembly that is encapsulated by damping layer 608 or a surface area of PCB 304 that is covered by damping layer 608. The above description provides the details necessary for one skilled in the art to perform such optimization.

Figure 17:
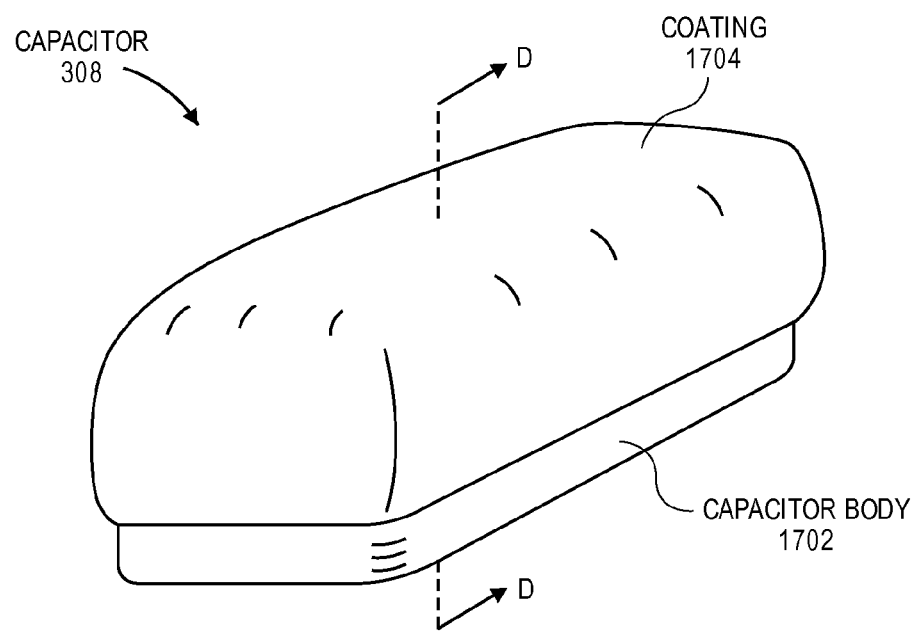
FIG. 17 is a perspective view of an epoxy-coated capacitor in accordance with an embodiment.

Referring to FIG. 17, a perspective view of an epoxy-coated capacitor is shown in accordance with an embodiment. Electronic component 306 incorporated in any of the PCB assemblies 302 described above may include an epoxy-coated capacitor 308. More particularly, an epoxy-coated capacitor 308 may be provided as an electronic component 306 that can be mounted directly on PCB 304, or may be mounted on interposer 902 and subsequently attached to PCB 304.

In an embodiment, an epoxy-coated capacitor 308 includes a capacitor body 1702 and a coating 1704 covering at least a portion of capacitor body 1702. Coating 1704 may include an epoxy material, e.g., a low modulus epoxy, having material properties such as those described below. As shown, coating 1704 may cover capacitor body 1702 incompletely to provide a receded covering, i.e., to expose at least a portion of the bottom and lateral sides of capacitor body 1702.

Figure 18:
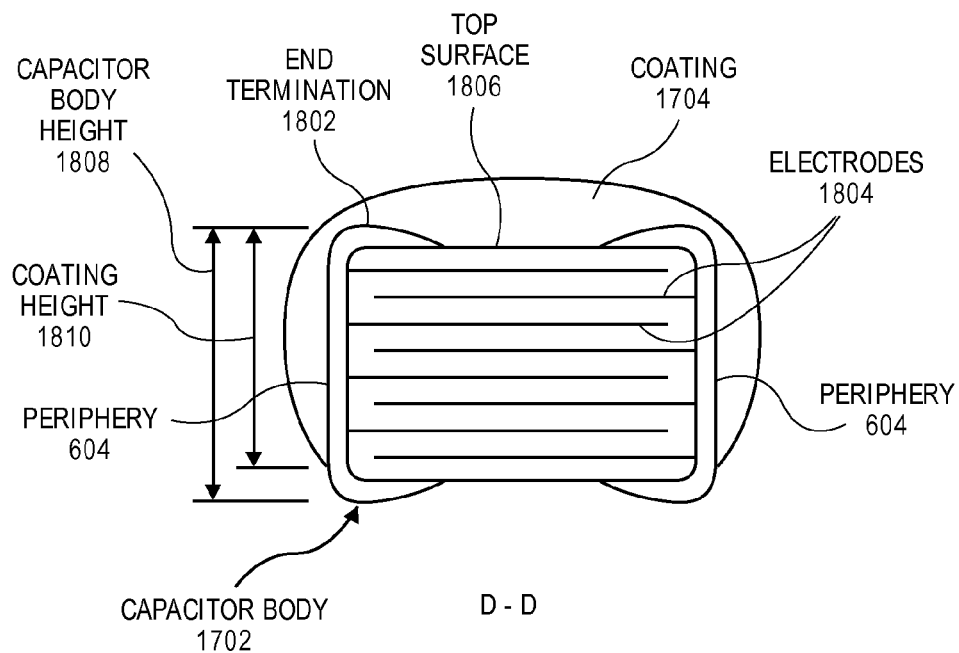
FIG. 18 is a sectional view, taken about line D-D of FIG. 17, of an epoxy-coated capacitor in accordance with an embodiment.

Referring to FIG. 18, a sectional view, taken about line D-D of FIG. 17, of an epoxy-coated capacitor is shown in accordance with an embodiment. Capacitor body 1702 may include known passive two-terminal capacitor parts, such as end terminations 1802 electrically connected with electrodes 1804, which are separated by a dielectric material. Furthermore, capacitor body 1702 may have reference geometry to embodiments of capacitor 308 described above, i.e., capacitor body 1702 may include a top surface 1806, periphery 604 defined by the lateral sides of capacitor body 1702, and a bottom surface that faces PCB 304 when epoxy-coated capacitor 308 is incorporated in PCB assembly 302. Capacitor body 1702, and more particularly periphery 604 of capacitor body 1702, may include a capacitor body height 1808. For example, capacitor body height 1808 may be a distance along periphery 604 between top surface 1806 and the bottom surface of capacitor body 1702.

In an embodiment, coating 1704 covers top surface 1806 and at least a portion of periphery 604 of capacitor body 1702. For example, coating 1704 may form a cap over an upper portion of capacitor body 1702. The cap may cover all or part of periphery 604. In an embodiment, covering 1704 extends over the entirety of top surface 1806 and along a portion of periphery 604 having a coating height 1810 that is less than capacitor body height 1808. For example, coating height may be between 50% and 99% of capacitor body height 1808. In an embodiment, the height of an exposed portion of periphery 604, i.e., the difference between capacitor body height 1808 and coating height 1810 is no more than 20% of capacitor body height 1808. For example, coating height 1810 may be at least 90% of capacitor body height 1808.

In an embodiment, coating 1704 includes a low modulus material such as a low modulus epoxy. A low modulus epoxy may be an epoxy have a modulus less than 1.0 GPa. For example, coating 1704 may include an epoxy having a modulus less than 0.5 GPa, e.g., between 0.2 to 0.5 GPa. Accordingly, the low modulus epoxy coating 1704 may provide both a moisture barrier and an acoustic damping mechanism to dampen excitatory vibrations from capacitor body 1702.

One skilled in the art will appreciate that coating 1704 may be applied over capacitor body 1702 in numerous manners. For example, a manufacturer of capacitor body 1702 or a third-party manufacturer may dip capacitor body 1702 into a low modulus epoxy. The epoxy coating 1704 formed by dipping may be cured to form epoxy cap over the predetermined portions, e.g., top surface 1806 and a portion of periphery 604. The epoxy-coated capacitor 308 may then be placed into a tape and reel. In an embodiment, the epoxy-coated capacitor 308 may be electrically and/or physically connected to an interposer 902, e.g., via solder 602 joints, and the capacitor-interposer subassembly may then be placed into a tape and reel. Thus, the epoxy-coated capacitor 308 may be provided in tape and reel carriers as a finished product for use in fabricating PCB assemblies 302.

As described above, the epoxy-coated capacitor 308 and/or the capacitor-interposer subassembly may be attached to PCB 304 via solder 602 joints. Subsequently, additional materials may be loaded over or under epoxy-coated capacitor 308. For example, encapsulation layer 802, damping layer 608, and/or overmold layer 702 may be applied over coating 1704. Similarly, in an embodiment, damping layer 608 fills gap 606 between PCB 304 and the bottom surface of epoxy-coated capacitor 308 and/or interposer 902 to form an underfill portion.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A printed circuit board assembly, comprising:
   a printed circuit board (PCB) having a first flexural modulus and a top surface;
   a plurality of electronic components mounted on the top surface of the PCB;
   a damping layer mounted on the top surface of the PCB, wherein the damping layer includes a continuous layer of viscoelastic material covering the plurality of electronic components, wherein the damping layer is attached to the top surface of the PCB at a plurality of locations around the plurality of electronic components, and wherein the damping layer includes a second flexural modulus lower than the first flexural modulus; and
   an overmold layer mounted on the top surface of the PCB, wherein the overmold layer is a continuous layer of waterproof material covering the plurality of electronic components and the continuous layer of viscoelastic material, and wherein the overmold layer is in direct contact with the damping layer and is attached to the top surface of the PCB at a plurality of locations around the damping layer.

2. The printed circuit board assembly of claim 1, wherein the PCB includes a first density and the damping layer includes a second density, and wherein a first ratio of the first flexural modulus to the first density is greater than a second ratio of the second flexural modulus to the second density.

3. The printed circuit board assembly of claim 1, wherein the overmold layer constrains the damping layer against the PCB.

4. The printed circuit board assembly of claim 3, wherein the overmold layer includes a third flexural modulus higher than the second flexural modulus, and wherein the damping layer includes a first damping loss factor higher than a second damping loss factor of the overmold layer.

5. The printed circuit board assembly of claim 4, wherein the plurality of electronic components include a capacitor, and further comprising an encapsulation layer covering the capacitor and disposed between the damping layer and the PCB, wherein the encapsulation layer includes a fourth flexural modulus lower than the third flexural modulus.

6. The printed circuit board assembly of claim 5, wherein the encapsulation layer surrounds a periphery of the capacitor, and wherein the damping layer is in direct contact with and surrounds the encapsulation layer around the periphery.

7. The printed circuit board assembly of claim 1, wherein the plurality of electronic components include a capacitor, and further comprising
   an interposer between the capacitor and the PCB, wherein the interposer includes an upper contact electrically connected to the capacitor, a lower contact electrically connected to the PCB, and a via electrically connected with the upper contact and the lower contact and laterally offset from one or more of the upper contact or the lower contact.

8. The printed circuit board assembly of claim 7, wherein the capacitor includes a normal centerline perpendicular to the PCB, and wherein the normal centerline is nearer to the lower contact than the upper contact.

9. The printed circuit board assembly of claim 7, wherein the via includes a first via segment extending downward from a top face of the interposer and a second via segment extending upward from a bottom face of the interposer, and wherein the first via segment is laterally offset from the second via segment.

10. The printed circuit board assembly of claim 9, wherein the interposer includes at least two layers having one or more interface surfaces between the top face and the bottom face, and wherein the first via segment extends from the top face to an interface surface and the second via segment extends from the bottom face to the interface surface.

11. The printed circuit board assembly of claim 10, wherein the interposer includes a trace extending along the interface surface between the first via segment and the second via segment.

12. The printed circuit board assembly of claim 10 further comprising an acoustic trap extending from the via along one of the one or more interface surfaces to trap vibrational acoustics of a predetermined wavelength, wherein the acoustic trap includes a trap length equal to one-quarter of the predetermined wavelength.

13. The printed circuit board assembly of claim 7 further comprising an encapsulation layer covering the capacitor and disposed between the damping layer and the PCB, wherein the encapsulation layer includes a third flexural modulus lower than the second flexural modulus.

14. The printed circuit board assembly of claim 13, wherein the encapsulation layer surrounds a periphery of the capacitor, and wherein the damping layer is in direct contact with and surrounds the encapsulation layer around the periphery.

15. A method, comprising:
mounting a plurality of electronic components on a top surface of a printed circuit board (PCB), wherein the PCB includes a first flexural modulus;
depositing a damping layer on the top surface of the PCB, wherein the damping layer includes a continuous layer of viscoelastic material over the plurality of electronic components, wherein the damping layer is attached to the top surface of the PCB at a plurality of locations around the plurality of electronic components, and wherein the damping layer includes a second flexural modulus lower than the first flexural modulus; and
depositing an overmold layer on the top surface of the PCB, wherein the overmold layer is a continuous layer of waterproof material over the plurality of electronic components and the continuous layer of viscoelastic material, and wherein the overmold layer is in direct contact with the damping layer and is attached to the top surface of the PCB at a plurality of locations around the damping layer and constrains the damping layer against the PCB.

16. The method of claim 15, wherein the overmold layer includes a third flexural modulus higher than the second flexural modulus.

17. The method of claim 16, wherein the plurality of electronic components include a capacitor, and further comprising depositing an encapsulation layer over the capacitor, wherein the encapsulation layer includes a fourth flexural modulus lower than the third flexural modulus.

18. The method of claim 17, wherein mounting the capacitor on the PCB includes:
mounting the capacitor on an interposer, wherein the interposer includes an upper contact electrically connected to the capacitor; and
mounting the interposer on the PCB, wherein the interposer includes a lower contact electrically connected to the PCB, and wherein the interposer includes a via electrically connected with the upper contact and the lower contact, the via being laterally offset from one or more of the upper contact or the lower contact.

* * * * *